(12) United States Patent
Kurokawa

(10) Patent No.: US 10,197,627 B2
(45) Date of Patent: Feb. 5, 2019

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 793 days.

(21) Appl. No.: 14/532,226

(22) Filed: Nov. 4, 2014

(65) Prior Publication Data

US 2015/0123684 A1    May 7, 2015

(30) Foreign Application Priority Data

Nov. 7, 2013  (JP) ................. 2013-230922

(51) Int. Cl.
*G01R 31/28* (2006.01)
*G01R 31/3181* (2006.01)

(52) U.S. Cl.
CPC .............. *G01R 31/31813* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS 3,673,573 A   6/1972  Smith
4,654,829 A   3/1987  Jiang et al.
5,544,307 A   8/1996  Maemura
5,731,856 A   3/1998  Kim et al.
5,744,864 A   4/1998  Cillessen et al.
5,822,755 A   10/1998 Shippy
6,097,212 A   8/2000  Agrawal et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Tung X Nguyen
(74) *Attorney, Agent, or Firm* — Fish & Richardson P.C.

(57) ABSTRACT

Provided is a semiconductor device which can generate a new test pattern even after design and have a reduced footprint of a circuit not used in normal operation. The semiconductor device includes a first integrated circuit and a second integrated circuit. The first integrated circuit includes a memory circuit that stores data and a plurality of circuits that make a signal for an operation test of the second integrated circuit. The signal is made when the continuity between the plurality of circuits is controlled by the memory circuit according to the data. In the second integrated circuit, the memory circuit is used as a buffer memory device after the operation test is conducted according to the signal.

7 Claims, 16 Drawing Sheets

(56) References Cited

U.S. PATENT DOCUMENTS

| | | | |
|---|---|---|---|
| 6,127,702 A | 10/2000 | Yamazaki et al. | |
| 6,282,644 B1 | 8/2001 | Ko | |
| 6,294,274 B1 | 9/2001 | Kawazoe et al. | |
| 6,436,741 B2 | 8/2002 | Sato et al. | |
| 6,501,692 B1* | 12/2002 | Melanson | G11C 29/50 |
| | | | 365/154 |
| 6,563,174 B2 | 5/2003 | Kawasaki et al. | |
| 6,601,218 B2 | 7/2003 | Sato et al. | |
| 6,615,402 B2 | 9/2003 | Kaneko et al. | |
| 6,678,645 B1 | 1/2004 | Rajsuman et al. | |
| 6,727,522 B1 | 4/2004 | Kawasaki et al. | |
| 6,829,735 B1 | 12/2004 | Aoyama | |
| 6,874,107 B2 | 3/2005 | Lesea | |
| 6,883,092 B2 | 4/2005 | Sasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,245,134 B2 | 7/2007 | Granicher et al. | |
| 7,256,613 B1 | 8/2007 | Sharpe-Geisler et al. | |
| 7,282,782 B2 | 10/2007 | Hoffman et al. | |
| 7,297,977 B2 | 11/2007 | Hoffman et al. | |
| 7,307,433 B2 | 12/2007 | Miller et al. | |
| 7,323,356 B2 | 1/2008 | Hosono et al. | |
| 7,342,414 B2 | 3/2008 | Dehon et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,487,416 B2 | 2/2009 | Oota | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,411,480 B2 | 4/2013 | Nagatsuka et al. | |
| 8,476,927 B2 | 7/2013 | Nishijima | |
| 8,547,753 B2 | 10/2013 | Takemura et al. | |
| 8,570,065 B2 | 10/2013 | Kobayashi et al. | |
| 8,581,610 B2 | 11/2013 | Miller et al. | |
| 8,675,382 B2 | 3/2014 | Kurokawa | |
| 8,687,416 B2 | 4/2014 | Kurokawa | |
| 9,065,438 B2 | 6/2015 | Aoki et al. | |
| 9,093,136 B2 | 7/2015 | Kurokawa | |
| 2001/0046027 A1 | 11/2001 | Tai et al. | |
| 2001/0054175 A1 | 12/2001 | Watanabe | |
| 2002/0010886 A1 | 1/2002 | Tanaka et al. | |
| 2002/0031193 A1 | 3/2002 | Harrison | |
| 2002/0056838 A1 | 5/2002 | Ogawa | |
| 2002/0132454 A1 | 9/2002 | Ohtsu et al. | |
| 2003/0080776 A1 | 5/2003 | Kohno et al. | |
| 2003/0097510 A1 | 5/2003 | Joseph | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0030056 A1 | 2/2005 | Woo et al. | |
| 2005/0121789 A1 | 6/2005 | Madurawe | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0025143 A1 | 2/2007 | Fujita et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0094486 A1 | 4/2007 | Moore et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0234160 A1 | 10/2007 | Oota | |
| 2007/0252928 A1 | 11/2007 | Ito et al. | |
| 2007/0272922 A1 | 11/2007 | Kim et al. | |
| 2007/0279087 A1 | 12/2007 | Imafuku | |
| 2007/0287296 A1 | 12/2007 | Chang | |
| 2008/0006877 A1 | 1/2008 | Mardilovich et al. | |
| 2008/0028148 A1 | 1/2008 | Wallner et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0072232 A1 | 3/2009 | Hayashi et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0282303 A1 | 11/2009 | Andreev et al. | |
| 2010/0026329 A1* | 2/2010 | Watanabe | G01R 31/31813 |
| | | | 324/756.01 |
| 2010/0042870 A1 | 2/2010 | Amatsubo | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0116332 A1 | 5/2011 | Naka et al. | |
| 2011/0148455 A1* | 6/2011 | Kato | G01R 31/275 |
| | | | 324/762.01 |
| 2011/0241121 A1 | 10/2011 | Kwon et al. | |
| 2011/0255325 A1 | 10/2011 | Nagatsuka et al. | |
| 2012/0212995 A1 | 8/2012 | Kurokawa | |
| 2012/0230078 A1 | 9/2012 | Fujita | |
| 2012/0268164 A1 | 10/2012 | Kobayashi et al. | |
| 2012/0274355 A1 | 11/2012 | Nishijima | |
| 2012/0293201 A1 | 11/2012 | Fujita et al. | |
| 2012/0293206 A1 | 11/2012 | Yoneda et al. | |
| 2012/0311365 A1 | 12/2012 | Yoneda et al. | |
| 2013/0207170 A1 | 8/2013 | Kurokawa | |
| 2013/0262828 A1 | 10/2013 | Yoneda | |
| 2013/0285697 A1 | 10/2013 | Kurokawa | |
| 2013/0285698 A1 | 10/2013 | Fukutome | |
| 2013/0286757 A1 | 10/2013 | Takemura | |

(56) References Cited

U.S. PATENT DOCUMENTS

| | | |
|---|---|---|
| 2013/0293266 A1 | 11/2013 | Takemura |
| 2013/0300456 A1 | 11/2013 | Lennon |
| 2013/0314124 A1 | 11/2013 | Ikeda et al. |
| 2013/0321025 A1 | 12/2013 | Kurokawa et al. |
| 2013/0326206 A1 | 12/2013 | Lueck et al. |
| 2013/0346780 A1 | 12/2013 | Hara |
| 2014/0225644 A1 | 8/2014 | Aoki et al. |
| 2014/0312932 A1 | 10/2014 | Ikeda |
| 2014/0340115 A1 | 11/2014 | Kurokawa |
| 2014/0368235 A1 | 12/2014 | Aoki et al. |
| 2015/0001529 A1* | 1/2015 | Kurokawa .......... H01L 27/1229 257/43 |
| 2015/0008958 A1 | 1/2015 | Kurokawa |
| 2015/0123704 A1 | 5/2015 | Kurokawa |
| 2015/0131356 A1 | 5/2015 | Kurokawa |
| 2015/0144948 A1 | 5/2015 | Kurokawa |
| 2015/0145559 A1 | 5/2015 | Kozuma |
| 2015/0154095 A1* | 6/2015 | Kang ...................... G06F 11/27 714/733 |
| 2015/0188520 A1 | 7/2015 | Aoki et al. |
| 2015/0192641 A1 | 7/2015 | Kurokawa |
| 2015/0207509 A1 | 7/2015 | Kurokawa |
| 2015/0212906 A1 | 7/2015 | Gschwind et al. |
| 2015/0221672 A1 | 8/2015 | Kozuma et al. |
| 2015/0226791 A1 | 8/2015 | Kurokawa |
| 2015/0226793 A1 | 8/2015 | Kurokawa |
| 2015/0226802 A1 | 8/2015 | Kurokawa |
| 2015/0227378 A1 | 8/2015 | Kurokawa |
| 2015/0227379 A1 | 8/2015 | Kurokawa |
| 2015/0229309 A1 | 8/2015 | Kurokawa |
| 2015/0242280 A1 | 8/2015 | Busaba et al. |
| 2016/0285457 A1 | 9/2016 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-142297 A | 6/1993 |
| JP | 05-251705 A | 9/1993 |
| JP | 08-264794 A | 10/1996 |
| JP | 10-161903 A | 6/1998 |
| JP | 11-505377 | 5/1999 |
| JP | 2000-044236 A | 2/2000 |
| JP | 2000-150900 A | 5/2000 |
| JP | 2002-007373 A | 1/2002 |
| JP | 2002-076356 A | 3/2002 |
| JP | 2002-289859 A | 10/2002 |
| JP | 2002-367397 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-096728 A | 4/2010 |
| JP | 2012-150875 A | 8/2012 |
| WO | WO-2000/062339 | 10/2000 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Kikuchi.H et al., "62.2:Invited Paper:Fast Electro-Optical Switching in Polymer-Stabilized Liquid Crystalline Blue-Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

(56) References Cited

OTHER PUBLICATIONS

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

\* cited by examiner

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof. In particular, one embodiment of the present invention relates to a semiconductor device into which a test circuit is incorporated.

2. Description of the Related Art

A built-in self-test (BIST) is a test mechanism incorporating a function of a circuit tester, which is a semiconductor-testing device, into an integrated circuit. BIST is known to reduce cost for the operation test of a semiconductor device and to achieve a high-speed operation test. Patent Document 1 discloses a technique in which a field-programmable gate array (FPGA) is used for a self-testing (BIST) circuit.

REFERENCE

Patent Document

[Patent Document 1] Japanese Published Patent Application No. H5-142297

SUMMARY OF THE INVENTION

A highly qualified operation test using BIST or the operation test of a semiconductor device having a complicated function using BIST requires a variety of test patterns. However, as the number and kinds of required test patterns increase, the scale of a circuit for generating test patterns (hereinafter, such a circuit is referred to as a BIST circuit) increases, leading to an increase in the footprint of a semiconductor device into which a BIST circuit and a circuit to be tested are incorporated.

In addition, since test patterns which can be generated by the BIST circuit during the design phase are fixed, an additional test pattern needs to be supplied from the outside of the semiconductor device to add an operation test after design. In that case, the effects of BIST, such as a high-speed operation test and a cost reduction of the operation test, cannot be obtained.

In view of the foregoing technical background, an object of one embodiment of the present invention is to provide a semiconductor device in which the footprint of a circuit not used in normal operation is reduced. Another object of one embodiment of the present invention is to provide a semiconductor device which generates a new test pattern even after design.

An object of one embodiment of the present invention is to provide a novel semiconductor device. Note that the descriptions of these objects do not disturb the existence of other objects. In one embodiment of the present invention, there is no need to achieve all of these objects. Other objects will be apparent from and can be derived from the description of the specification, the drawings, the claims, and the like.

A semiconductor device of one embodiment of the present invention includes a first circuit and a second circuit. The first circuit includes a third circuit that stores data and a plurality of fourth circuits that make a signal for an operation test of the second circuit. The signal is made when continuity between the plurality of fourth circuits is controlled by the third circuit according to the data. The third circuit functions as a buffer memory device of the second circuit after the operation test conducted according to the signal.

A semiconductor device of one embodiment of the present invention includes a first circuit and a second circuit. The first circuit includes a third circuit that stores data and a plurality of fourth circuits that make a signal for an operation test of the second circuit. The signal is made when continuity between the plurality of fourth circuits is controlled by the third circuit according to the data. The second circuit includes a fifth circuit. The fifth circuit alone functions as a set associative buffer memory device when the operation test is conducted according to the signal, whereas the fifth circuit functions as a set associative buffer memory device together with the third circuit, after the operation test conducted according to the signal.

In the semiconductor device of one embodiment of the present invention, the third circuit may include a plurality of groups each including at least a first transistor and a second transistor. The on/off of the second transistor is selected according to the data input through the first transistor.

In the semiconductor device of one embodiment of the present invention, the first transistor may include a channel formation region in an oxide semiconductor film.

In the semiconductor device of one embodiment of the present invention, the oxide semiconductor film may contain In, Ga, and Zn.

One embodiment of the present invention can provide a semiconductor device in which the footprint of a circuit not used in normal operation can be reduced. One embodiment of the present invention can provide a semiconductor device which can generate a new test pattern even after design.

One embodiment of the present invention can provide a novel semiconductor device. Note that the descriptions of these effects do not disturb the existence of other effects. In one embodiment of the present invention, there is no need to achieve all of these effects. Other effects will be apparent from and can be derived from the description of the specification, the drawings, the claims, and the like.

DETAILED DESCRIPTION OF THE INVENTION

Figure 1:
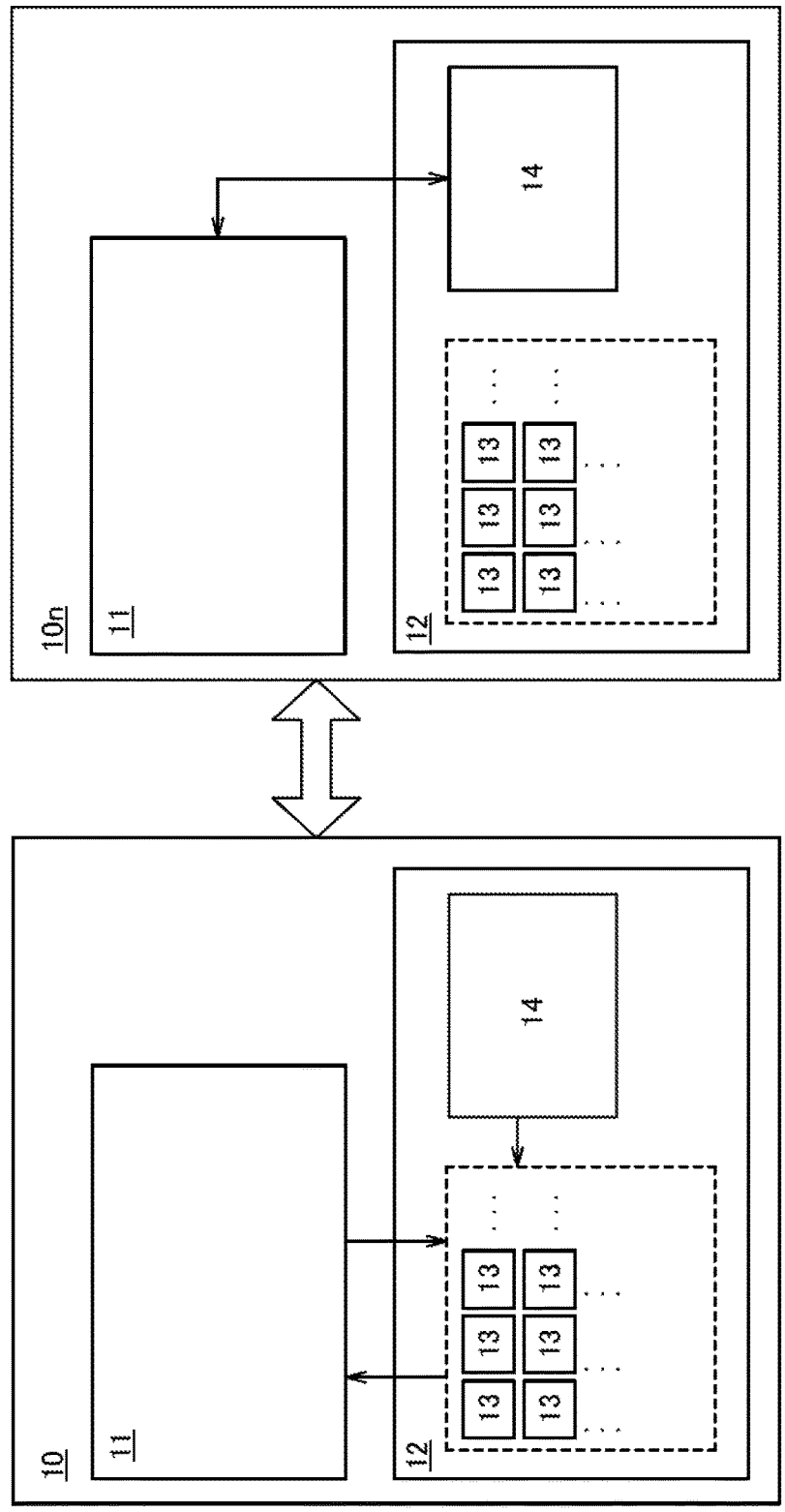
FIG. 1 illustrates a configuration example of a semiconductor device.

An embodiment of the present invention will be described below in detail with reference to the drawings. Note that the present invention is not limited to the following description. Note that the present invention is not limited to the following description, and it is easily understood by those skilled in the art that the mode and details can be variously changed without departing from the spirit and scope of the present invention. Therefore, the present invention should not be construed as being limited to the description of the embodiment below.

Note that the present invention includes, in its category, any semiconductor device including a semiconductor integrated circuit, such as an RF tag and a semiconductor display device. The semiconductor display device includes, in its category, a semiconductor display device in which a semiconductor integrated circuit is included in a driver circuit, such as a liquid crystal display device, a light-emitting device in which a light-emitting element typified by an organic light-emitting element is provided in each pixel, an electronic paper, a digital micromirror device (DMD), a plasma display panel (PDP), a field emission display (FED), and the like.

Note that the term "connection" in this specification refers to electrical connection and corresponds to a state of a circuit configuration in which current, voltage, or a potential can be supplied or transmitted. Accordingly, a connection circuit means not only a state of direct connection but also a state of indirect connection through an element such as a wiring, a resistor, a diode, or a transistor so that current, voltage, or a potential can be supplied or transmitted. In addition, even when different components are connected to each other in a circuit diagram, there is actually a case where one conductive film has functions of a plurality of components such as a case where part of a wiring serves as an electrode. The term "connection" in this specification also means such a case where one conductive film has functions of a plurality of components.

Note that a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the conductivity of the channel of the transistor or levels of potentials applied to the terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

<Configuration Example 1 of Semiconductor Device>

FIG. 1 illustrates a configuration example of the semiconductor device of one embodiment of the present invention. A semiconductor device 10 illustrated in FIG. 1 includes an integrated circuit 11 and an integrated circuit 12. The integrated circuit 11 includes a plurality of transistors. Thus, the integrated circuit 11 can be regarded as a semiconductor integrated circuit and can be any logic circuit such as a sequential circuit or a combinational circuit. The integrated circuit 12 includes circuits 13 and a memory circuit 14.

The memory circuit 14 has a function of storing data and a function of controlling the continuity between the circuits 13 according to the data. When the continuity between the circuits 13 is controlled by the memory circuit 14 according to data containing circuit configuration data, which is stored in the memory circuit 14, the circuits 13 generate a signal for the operation test (hereinafter, such a signal is referred to as a test pattern) of the integrated circuit 11. The specific configuration of the memory circuit 14 will be described later.

The integrated circuit 11 operates according to a test pattern generated in the integrated circuit 12; as a result, a signal is output from the integrated circuit 11. In the semiconductor device 10 of one embodiment of the present invention, data containing circuit configuration data, which is stored in the memory circuit 14, may provide the circuits 13 with a function of determining the operation state of the integrated circuit 11 with the use of the signal.

In the integrated circuit 12, at least one of the circuits 13 may have a configuration with which the kind of logic operation, specifically, the logical value of an output signal corresponding to the logical value of an input signal, is determined according to data containing circuit configuration data. When the circuits 13 each have a configuration with which a logic operation can be changed, a variety of test patterns can be generated by the circuits 13. Accordingly, in the semiconductor device 10 of one embodiment of the present invention, the number of kinds of test pattern that can be generated by the circuits 13 can be increased with a small number of gates in the circuits 13. Furthermore, an additional operation test can be conducted without supplying an additional test pattern from the outside of the semiconductor device.

Note that the integrated circuit 12 may further include a memory circuit for storing data containing circuit configuration data, which determines the kind of logic operation executed by each of the circuits 13.

A test pattern generated by the circuits 13 may be a signal for the operation test of some circuits in the integrated circuit 11 or for the operation test of the whole integrated circuit 11. In the case where the integrated circuit 11 includes a memory circuit, for example, the circuits 13 can generate a test pattern for the operation test of the memory circuit. In the case where the integrated circuit 11 includes an analog circuit such as a circuit that can synchronize phases, for example, the circuits 13 can generate a test pattern for the operation test of the analog circuit.

When the operation test of the integrated circuit 11 is not conducted (i.e., when a normal operation is conducted) in one embodiment of the present invention, data is transferred between the memory circuit 14 and the integrated circuit 11. A semiconductor device 10n illustrated in FIG. 1 is the semiconductor device 10 in normal operation. In the semiconductor device 10n, the data storage function of the memory circuit 14 is utilized for the integrated circuit 11.

Note that switching between the operation state where the continuity between the circuits 13 is controlled by the memory circuit 14 and the operation state where data is transferred between the memory circuit 14 and the integrated circuit 11 can be done according to an instruction input from an input device (not illustrated). Alternatively, an instruction used for switching the operation states may be stored in a memory device (not illustrated) included in the integrated circuit 11 so that the switching between the operation states can be done according to the instruction when the semiconductor device 10 is powered on.

The switching between signal paths, which is accompanied by the switching between the operation states, may be done by a switch (not illustrated). Alternatively, the signal paths may be switched by placing the outputs of the circuits 13 in high impedance states so that the circuits 13 are electrically disconnected.

In the semiconductor device 10 of one embodiment of the present invention, data for the logic operation executed by the integrated circuit 11, data obtained as a result of the logic operation executed by the integrated circuit 11, instructions executed by the integrated circuit 11, or the like can be stored in the memory circuit 14 in normal operation of the integrated circuit 11. This means that the memory circuit 14 is used for the operation of the semiconductor device 10 not only at the time of the operation test of the integrated circuit 11, but also at the time of the normal operation. Thus, in the semiconductor device 10 of one embodiment of the present invention, the footprint of a circuit not used in normal operation can be reduced.

<Configuration Example 2 of Semiconductor Device>

Figure 2:
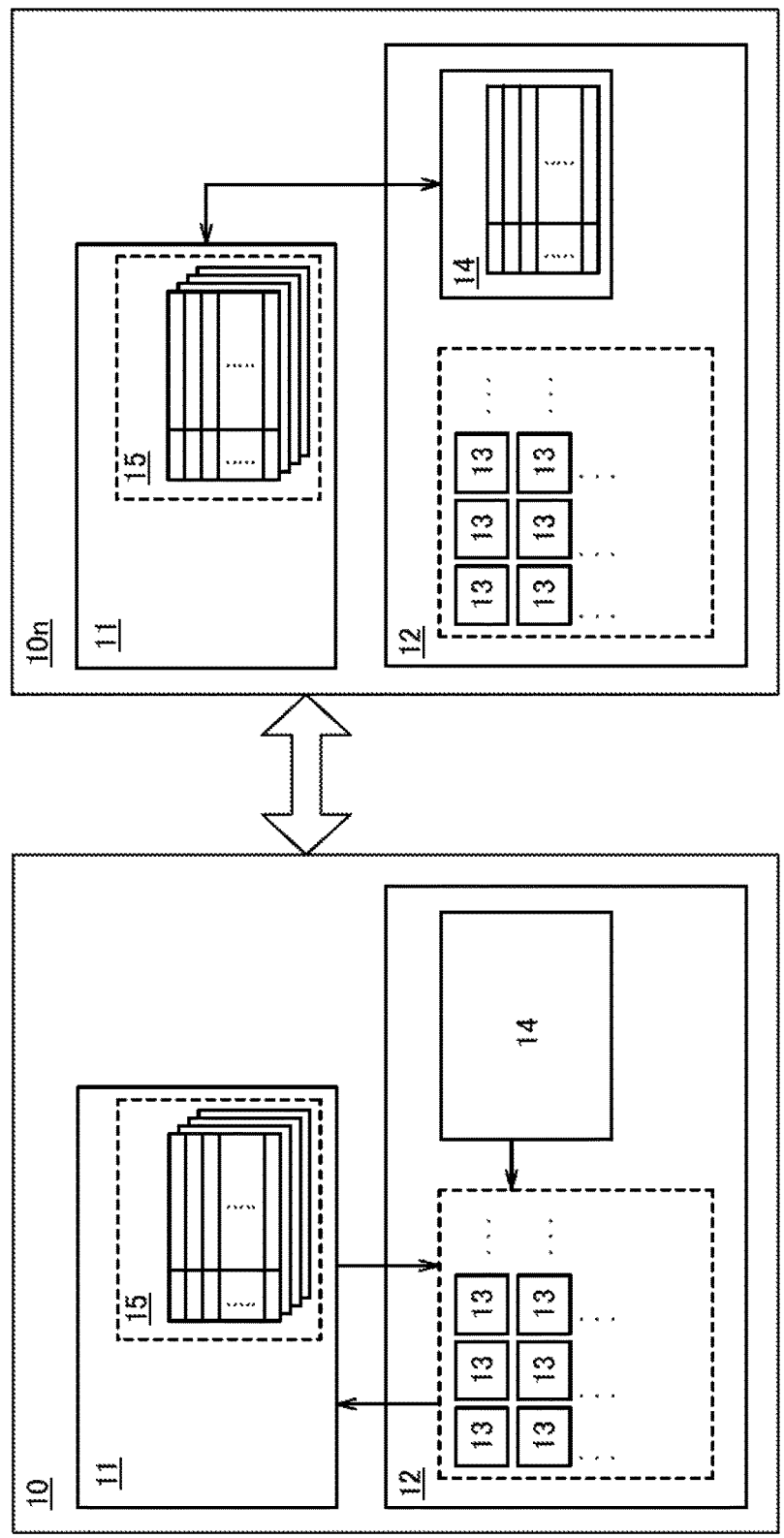
FIG. 2 illustrates a configuration example of a semiconductor device.

FIG. 2 illustrates a specific configuration example of the semiconductor device 10 illustrated in FIG. 1.

Similarly to the semiconductor device 10 in FIG. 1, the semiconductor device 10 illustrated in FIG. 2 includes the integrated circuit 11 and the integrated circuit 12, and the integrated circuit 12 includes the circuits 13 and the memory circuit 14. Note that in the semiconductor device 10 in FIG. 2, the integrated circuit 11 includes a memory circuit 15.

A test pattern generated by the circuits 13 may be a signal for the operation test of some circuits in the integrated circuit 11 or for the operation test of the whole integrated circuit 11. In the semiconductor device 10 illustrated in FIG. 2, the circuits 13 can generate a test pattern for the operation test of the memory circuit 15.

The semiconductor device 10n illustrated in FIG. 2 is the semiconductor device 10 in normal operation. As in the semiconductor device 10 illustrated in FIG. 1, data is transferred between the memory circuit 14 and the integrated circuit 11 in normal operation of the integrated circuit 11. In the semiconductor device 10n, the data storage function of the memory circuit 14 is utilized for the integrated circuit 11.

Furthermore, in normal operation of the semiconductor device 10 illustrated in FIG. 2, the memory circuit 15 can function as a set associative buffer memory device together with the memory circuit 14. Specifically, for example, the memory circuit 15 can function as an n-way set associative buffer memory device (n is a natural number of 2 or more) when the operation test of the integrated circuit 11 is conducted, whereas the memory circuit 15 and the memory circuit 14 can function as an (n+m)-way set associative buffer memory device (m is a natural number) in normal operation of the integrated circuit 11.

In the semiconductor device 10 of one embodiment of the present invention, the memory circuit 14 can be used for the operation of the semiconductor device 10 not only at the time of the operation test of the integrated circuit 11, but also at the time of the normal operation. Thus, in the semiconductor device 10 of one embodiment of the present invention, the footprint of a circuit not used in normal operation can be reduced. Furthermore, in one embodiment of the present invention, in normal operation, the memory circuit 15 can be used as a set associative buffer memory device together with the memory circuit 14 whereby the number of sets of a buffer memory device can be increased in comparison with the case of not using the memory circuit 14 as part of a set associative buffer memory device. As a result, thrashing of the semiconductor device 10 becomes less likely to occur; thus, the hit rate of the buffer memory device and the performance of the semiconductor device 10 can be increased.

<Specific Configuration Examples of Semiconductor Device>

Figure 3:
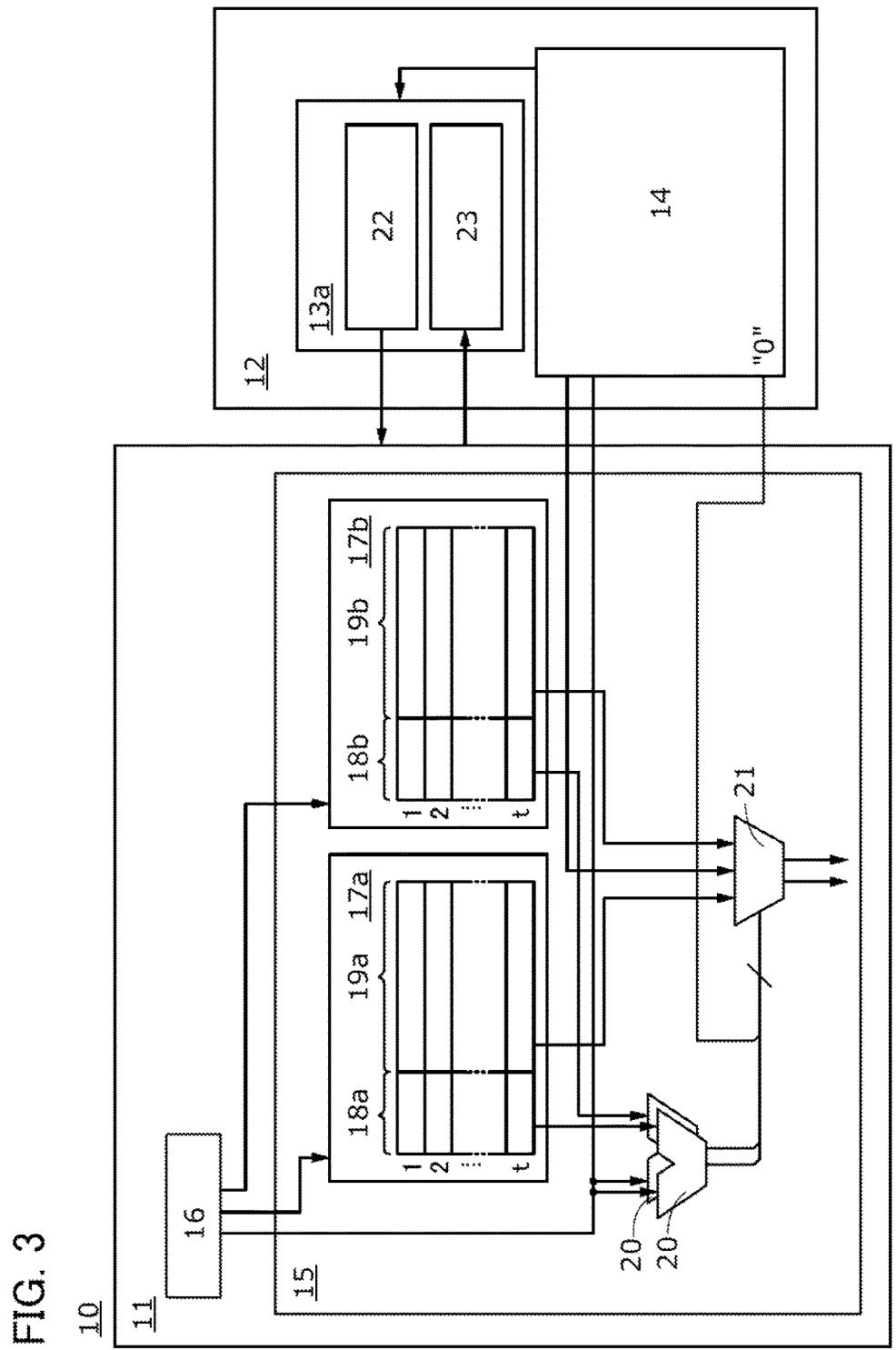
FIG. 3 illustrates a configuration example of a semiconductor device.
Figure 4:
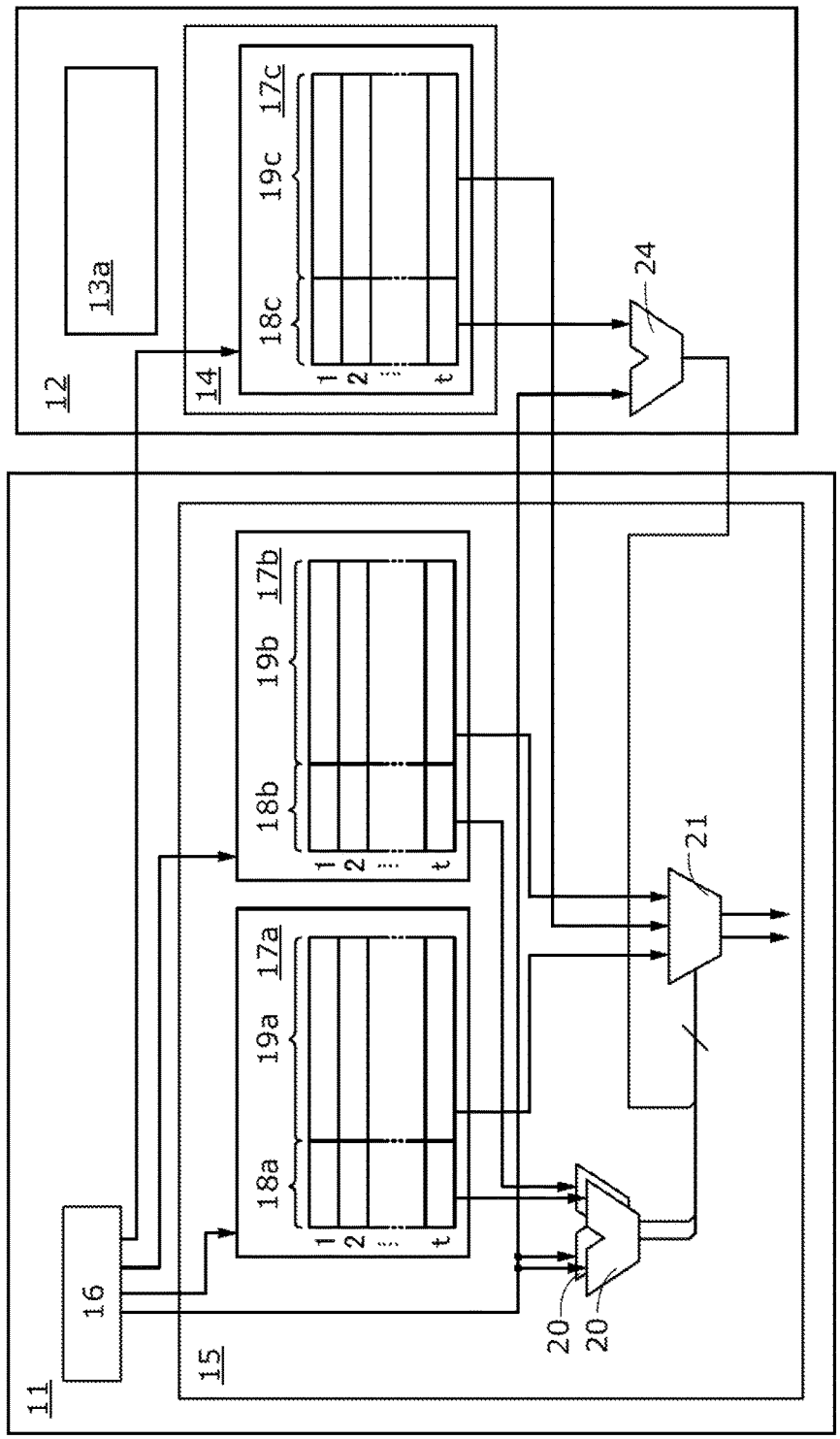
FIG. 4 illustrates a configuration example of a semiconductor device.

FIGS. 3 and 4 each illustrate a specific configuration example of the semiconductor device 10 in FIG. 2. FIG. 3 illustrates a configuration example of the semiconductor device 10 when the operation test of the integrated circuit 11 is conducted. FIG. 4 illustrates a configuration example of the semiconductor device 10 in normal operation.

First, the configuration of the semiconductor device 10 illustrated in FIG. 3 is described. Similarly to the semiconductor device 10 in FIG. 2, the semiconductor device 10 illustrated in FIG. 3 includes the integrated circuit 11 and the integrated circuit 12. In the semiconductor device 10 illustrated in FIG. 3, the integrated circuit 11 includes a processor 16 and the memory circuit 15, and the integrated circuit 12 includes the memory circuit 14 and a circuit 13a including the circuits 13.

In the example illustrated in FIG. 3, the memory circuit 15 functions as a two-way set associative buffer memory device. Specifically, the memory circuit 15 includes a set 17a having a first memory region and a set 17b having a second memory region. The first memory region in the set 17a and the second memory region in the set 17b each have a plurality of memory regions (hereinafter, referred to as lines) containing a certain amount of information. In FIG. 3, each of the sets 17a and 17b has t lines (t is a natural number of 2 or more).

Each line of the set 17a has a data field 19a, which is a memory region where data is stored, and a tag field 18a, which is a memory region where high-order bits of the address of the data are stored. Similarly, each line of the set 17b has a data field 19b and a tag field 18b which stores high-order bits of the address of data stored in the data field 19b. Note that which data field of a line to store data is determined by low-order bits of the address.

The memory circuit 15 includes a selection circuit 21 and comparators 20 each provided for one set. The comparator 20 can compare high-order bits of an address access-requested by the processor 16 and high-order bits of an address read from the tag fields 18a and 18b. The selection circuit 21 can select one from data input from the plurality of sets, according to the comparison result produced by the plurality of comparators 20. In addition, the selection circuit 21 can output a signal containing the comparison result produced by the plurality of comparators 20, whether data access-requested by the processor 16 is stored in the memory circuit 15 (cache hit) or not (cache miss).

Note that the signal containing the comparison result produced by the plurality of comparators 20 can be generated by a circuit other than the selection circuit 21, such as an OR circuit.

Specifically, in the integrated circuit 11, when the access request of data is made by the processor 16, low-order bits of an address of the data are sent to the sets 17a and 17b and high-order bits of the address of the data are sent to the plurality of comparators 20. In the sets 17a and 17b, high-order bits of an address stored in the tag fields 18a and 18b of the line, which is determined by the low-order bits of the address, are read out and sent to the plurality of comparators 20. In addition, in the sets 17a and 17b, data stored in the data fields 19a and 19b of the line, which is determined by the low-order bits of the address, is read out and sent to the selection circuit 21.

The plurality of comparators 20 compare the high-order bits of the address access-requested by the processor 16 and the high-order bits of the address read from the tag fields 18a and 18b. If the comparators 20 result in that the high-order bits of those addresses match with each other, it means that the corresponding set stores the data access-requested by the processor 16. If the comparators 20 result in that the high-order bits of those addresses do not match with each other, it means that the data access-requested by the processor 16 is not stored in any of the sets. The comparison result is sent to the selection circuit 21.

In the case where a line in which the high-order bits of the access-requested address are contained is found as a result of the comparison by the plurality of comparators 20, the selection circuit 21 selects and outputs the data read out from the line. In addition, the selection circuit 21 generates and outputs a signal containing the comparison result produced by the plurality of comparators 20.

Although not illustrated in FIG. 3, in each line of the memory circuit 15, identification data on the validity of the data stored in the data field of the line is stored in a specific memory region.

The memory circuit 15 illustrated in FIG. 3 functions as a two-way set associative buffer memory device; however, in the semiconductor device 10 of one embodiment of the present invention, the memory circuit 15 may function as an n-way set associative buffer memory device, where n is a natural number greater than 2.

When the operation test of the integrated circuit 11 is conducted as illustrated in FIG. 3, in the integrated circuit 12, the continuity between the circuits 13 included in the circuit 13a is controlled by the memory circuit 14. As a result, the circuit 13a is provided with a function 22 of generating a test pattern for the operation test of the integrated circuit 11. Since the integrated circuit 11 in FIG. 3 operates according to the test pattern, the circuit 13a is also provided with a function 23 of determining the operation state of the integrated circuit 11 with the use of the signal output from the integrated circuit 11.

Furthermore, when the operation test of the integrated circuit 11 is conducted as illustrated in FIG. 3, a signal containing data indicating that the memory circuit 14 does not include the data access-requested by the processor 16 is sent from the memory circuit 14 to the selection circuit 21, in which case the data stored in the memory circuit 14 is not selected by the selection circuit 21. Alternatively, identification data indicating that all data stored in the memory circuit 14 is invalid may be input from the memory circuit 14 to the integrated circuit 11.

Here, the configuration of the semiconductor device 10 illustrated in FIG. 4 is described. The configurations of the circuit 13a and the memory circuit 14 in the semiconductor device 10 illustrated in FIG. 4 are different from those in the semiconductor device 10 illustrated in FIG. 3. As illustrated in FIG. 4, in the semiconductor device 10 of one embodiment of the present invention in normal operation, the memory circuit 14 can function as an (n+m)-way set associative buffer memory device (m is a natural number) together with the memory circuit 15. Specifically, in the semiconductor device 10 in FIG. 4, the memory circuit 14 has t lines and each line has a tag field 18c and a data field 19c.

In addition, the integrated circuit 12 in the semiconductor device 10 in FIG. 4 includes a comparator 24. Similarly to the comparator 20, the comparator 24 compares high-order bits of an address access-requested by the processor 16 and data stored in a tag field of the line determined by low-order bits of the address.

The comparator 24 may be included in the memory circuit 14. Alternatively, the circuit 13a may be provided with a function of the comparator 24, in which case data containing the configuration data used for providing the function of the comparator 24 for the circuit 13a is stored in part of a memory region in the memory circuit 14. Further alternatively, the comparator 24 may be included in the memory circuit 15.

In the case where the memory circuit 14 and the memory circuit 15 function as an (n+m)-way set associative buffer memory device, the memory circuit 14 has a region that functions as a memory region of m sets. In FIG. 4, the memory circuit 14 has a memory region that functions as a set 17c, for example.

Specifically, in the semiconductor device 10 illustrated in FIG. 4, when the access request of data is made by the processor 16, low-order bits of an address of the data are sent to the sets 17a to 17c and high-order bits of the address of the data are sent to the plurality of comparators 20 and the comparator 24. In the sets 17a to 17c, high-order bits of an address stored in the tag fields 18a to 18c of the line, which is determined by the low-order bits of the address, are read out and sent to the plurality of comparators 20 and the comparator 24. In addition, in the sets 17a to 17c, data stored in the data fields 19a to 19c of the line, which is determined by the low-order bits of the address, is read out and sent to the selection circuit 21.

The plurality of comparators 20 and the comparator 24 compare the high-order bits of the address access-requested by the processor 16 and the high-order bits of the address read from the tag fields 18a to 18c. If the comparator 20 and the comparator 24 result in that the high-order bits of those addresses match with each other, it means that the corresponding set stores the data access-requested by the processor 16. If the comparators 20 and the comparator 24 result in that the high-order bits of those addresses do not match with each other, it means that the data access-requested by the processor 16 is not stored in any of the sets. The comparison result is sent to the selection circuit 21.

In the case where a line in which the high-order bits of the access-requested address are contained is found as a result of the comparison by the plurality of comparators 20 and the comparator 24, the selection circuit 21 selects and outputs the data read out from the line. In addition, the selection circuit 21 generates and outputs a signal containing the comparison result produced by the plurality of comparators 20 and the comparator 24.

In the semiconductor device 10 of one embodiment of the present invention, as illustrated in FIGS. 3 and 4, the memory circuit 14 can be used for the operation of the semiconductor device 10 not only at the time of the operation test of the integrated circuit 11, but also at the time of the normal operation. Thus, in the semiconductor device 10 of one embodiment of the present invention, the footprint of a circuit not used in normal operation can be reduced. Furthermore, the memory circuit 15, together with the memory circuit 14, can be used as a set associative buffer memory device in normal operation, whereby the number of sets of a buffer memory device can be increased in comparison with the case of not using the memory circuit 14 as part of a set associative buffer memory device. As a result, thrashing of the semiconductor device 10 becomes less likely to occur; thus, the hit rate of the buffer memory device and the performance of the semiconductor device 10 can be increased.

<Configuration Example 1 of Cell Array>

Next, a specific configuration example of a cell array 14a included in the memory circuit 14 will be described.

Figure 5:
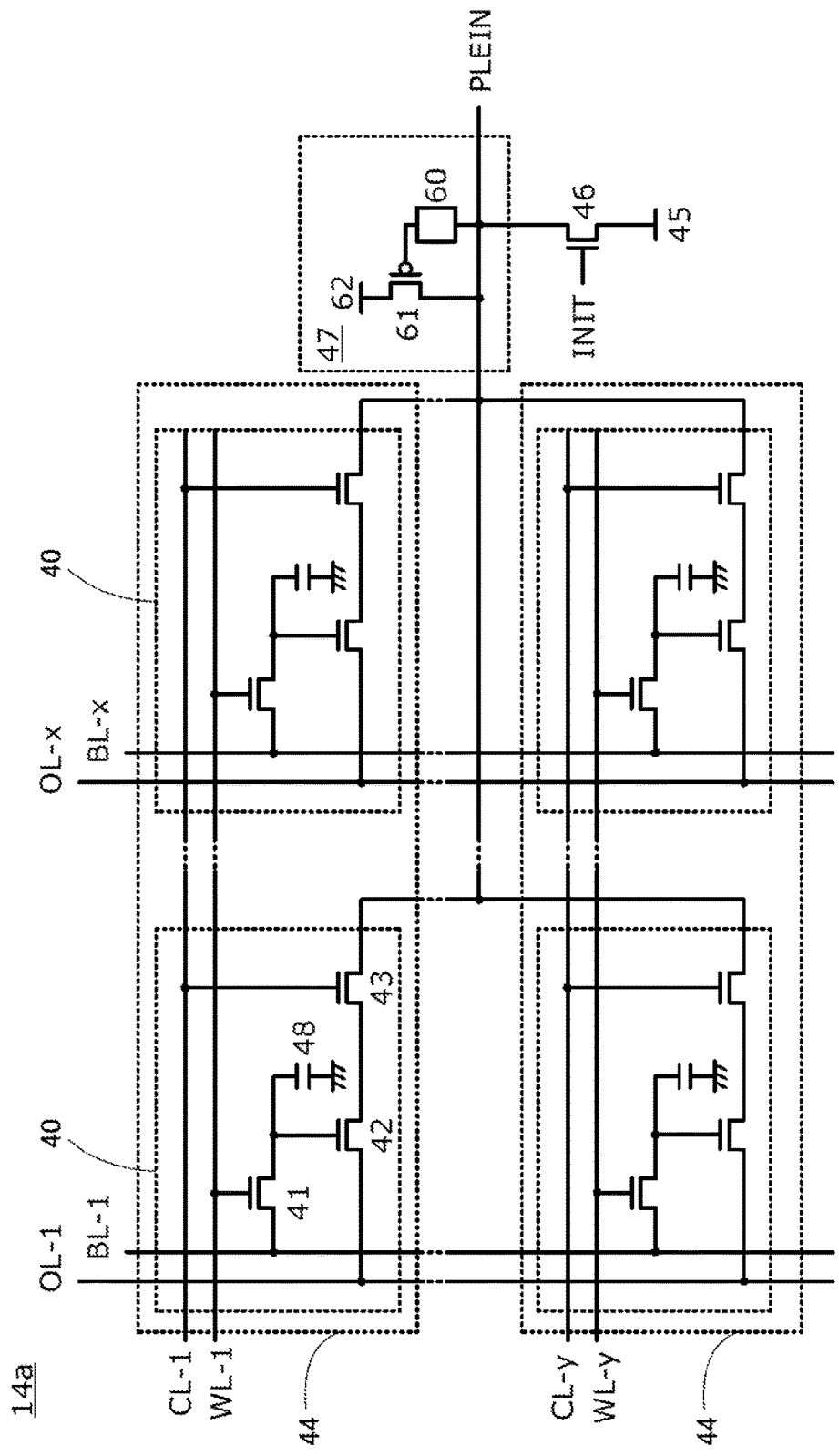
FIG. 5 illustrates a configuration example of a cell array.

The cell array 14a illustrated in FIG. 5 has a plurality of wirings BL represented as wirings BL-1 to BL-x (x is a natural number greater than 1), a plurality of wirings OL represented as wirings OL-1 to OL-x, a wiring PLEIN, a plurality of wirings WL represented as wirings WL-1 to WL-y (y is a natural number greater than 1), and a plurality of wirings CL represented as wirings CL-1 to CL-y. The cell array 14a illustrated in FIG. 5 also includes (x×y) circuits 40. Each of the circuits 40 includes at least a transistor 41, a transistor 42, a transistor 43, and a capacitor 48.

Note that (x×y) circuits 40 are divided into y groups 44, each of which are connected to a wiring WL-j and a wiring CL-j (j is a natural number less than y) and includes x circuits 40.

Specifically, in the circuit 40 in the j-th row and the i-th column (i is a natural number less than x), a gate of the transistor 41 is electrically connected to the wiring WL-j. One of a source and a drain of the transistor 41 is electrically connected to a wiring BL-i and the other is electrically connected to a gate of the transistor 42. One of a source and a drain of the transistor 42 is electrically connected to a wiring OL-i and the other is electrically connected to one of a source and a drain of the transistor 43. The other of the source and the drain of the transistor 43 is electrically connected to the wiring PLEIN. A gate of the transistor 43 is electrically connected to the wiring CL-j.

One terminal of the capacitor 48 is electrically connected to the gate of the transistor 42 and the other terminal of the capacitor 48 is electrically connected to a wiring. Note that the wiring is preferably supplied with a constant potential. Examples of the wiring include a wiring that can supply high-potential-side power supply voltage, a wiring that can supply low-potential-side power supply voltage, and a wiring that can supply the ground potential. Note that one embodiment of the present invention is not limited thereto. Depending on the case or the situation, a wiring that can supply a pulse signal can be used.

Each of the circuits 40 may also include another circuit element such as a transistor, a diode, a resistor, a capacitor, an inductor, or the like as necessary.

In each of the circuits 40 included in the cell array 14a illustrated in FIG. 5, when the potential of a signal containing data is supplied to the wiring BL while the transistor 41 is on, the potential is supplied to the gate of the transistor 42 through the transistor 41. Then, the transistor 41 is turned off, whereby the potential supplied to the gate of the transistor 42 is retained. The transistor 42 is turned on/off according to the potential of the gate which reflects the data.

Since the transistor 43 and the transistor 42 are electrically connected to each other in series, the transistor 43 controls the continuity (on/off) between the wiring OL and the wiring PLEIN, together with the transistor 42. Specifically, when the transistor 42 and the transistor 43 are on, the wiring OL and the wiring PLEIN are electrically connected to each other, which allows current to flow therebetween. In the case where at least one of the transistor 42 and the transistor 43 is off, the wiring OL and the wiring PLEIN are electrically isolated from each other. This means that the connection between the wiring PLEIN and the plurality of wirings OL is determined according to the potential of the signal containing data stored in each of the circuits 40.

Each of the wirings OL is connected to one of the circuits 13 illustrated in FIG. 1 or FIG. 2, and the wiring PLEIN is connected to another one of the circuits 13. Accordingly, the connection between the circuits 13 is controlled according to the data stored in each of the circuits 40 in the cell array 14a.

The cell array 14a illustrated in FIG. 5 includes a switch 46 for controlling the connection between the wiring PLEIN and a wiring 45 to which a predetermined potential is applied. In FIG. 5, one transistor is used as the switch 46. The on/off of the switch 46 is selected (switched) according to a signal input to a wiring INIT. Specifically, the potential of the wiring 45 is applied to the wiring PLEIN when the switch 46 is on, whereas the potential of the wiring 45 is not applied to the wiring PLEIN when the switch 46 is off.

By turning the switch 46 on, the potential of the wiring PLEIN can be initialized to be at a predetermined level. Note that even when the potential of the wiring PLEIN or the potential of the wiring OL is floating in a data storage period, the potential of the wiring PLEIN can be initialized to prevent a large amount of current from flowing between the wiring PLEIN and the plurality of wirings OL. This can prevent breakage of the memory circuit 14.

Note that in some cases, the potential of the wiring PLEIN becomes an intermediate potential, which is between a high-level potential and a low-level potential, in the data storage period. If the intermediate potential is applied to an input terminal of the circuit 13, a shoot-through current is likely to be generated in the circuit 13 connected to the wiring PLEIN. However, since the potential of the wiring PLEIN can be initialized as described above, the input terminal can be prevented from having the intermediate potential immediately after power is turned on; thus, generation of the shoot-through current can be prevented.

A latch may be electrically connected to the wiring PLEIN. In FIG. 5, in addition to the switch 46 for initialization, a latch 47 is electrically connected to the wiring PLEIN. The latch 47 has a function of keeping the potential of the wiring PLEIN high or low. Since the potential of the wiring PLEIN can be kept high or low when the wiring PLEIN is electrically connected to the latch 47, application of an intermediate potential to the wiring PLEIN can prevent a shoot-through current from being generated in the circuit 13 (illustrated in FIGS. 1 and 2) having the input terminal connected to the wiring PLEIN.

The latch 47 illustrated in FIG. 5 includes a transistor 61 and a circuit 60 which inverts the polarity of a potential. As the circuit 60, an inverter can be used, for example. An input terminal of the circuit 60 is electrically connected to the wiring PLEIN and an output terminal of the circuit 60 is electrically connected to a gate of the transistor 61. One of a source and a drain of the transistor 61 is electrically connected to a wiring 62 supplied with a potential higher than a potential supplied to the wiring 45, and the other is electrically connected to the wiring PLEIN.

Note that the transistor 41 in the cell array 14a illustrated in FIG. 5 preferably has extremely small off-state current because the transistor 41 retains the potential of the gate of the transistor 42. A transistor in which a channel formation region is formed in a film of a semiconductor having a wider band gap and lower intrinsic carrier density than silicon can have extremely small off-state current and thus is preferably used as the transistor 41. Examples of such a semiconductor are an oxide semiconductor and gallium nitride that have a band gap more than twice as wide as that of silicon. A transistor including the semiconductor can have much smaller off-state current than a transistor including a normal semiconductor such as silicon or germanium. Consequently, the use of the transistor 41 having the above structure can prevent leakage of electric charge held at the gate of the transistor 42.

In the cell array 14a illustrated in FIG. 5, when the transistor 41 of each of the circuits 40 is off, the gate of the transistor 42 becomes floating with excellent insulating property between the gate and other electrodes or wirings, so that a boosting effect described below can be obtained. Specifically, when the gate of the transistor 42 in the circuit 40 is floating, the potential of the gate of the transistor 42 is increased by a capacitance Cgs generated between the source and the gate of the transistor 42 serving as a switch, as the potential of the wiring OL changes from low a level to a high level. The increase in the potential of the gate of the transistor 42 depends on the logic level of configuration data input to the gate of the transistor 42. Specifically, when the potential of data input to the circuit 40 is at a logic level of "0", the transistor is in a weak inversion mode; thus, the capacitance Cgs that contributes to an increase in the potential of the gate of the transistor 42 includes a capacitance Cos that is independent of the potential of the gate electrode, that is, the potential of the gate of the transistor 42. The capacitance Cos specifically includes overlap capacitance generated in a region where the gate electrode and a source region overlap with each other, and parasitic capacitance generated between the gate electrode and the source electrode. Meanwhile, when the potential of data input to the circuit 40 is at a logic level of "1", the transistor is in a strong inversion mode; thus, the capacitance Cgs that contributes to an increase in the potential of the gate of the transistor 42 includes, in addition to the capacitance Cos, part of a capacitance Cox generated between a channel formation region and the gate electrode. Thus, the capacitance Cgs that contributes to an increase in the potential of the gate of the transistor 42 is larger with the potential at a logic level of "1" than with the potential at a logic level of "0". Consequently, the circuit 40 storing a potential at a logic level of "1" can have a larger boosting effect than the circuit 40 storing a potential at a logic level of "0"; by the boosting effect, the potential of the gate of the transistor 42 is increased with a change in the potential of the wiring OL. Thus, in the case where the potential of data input to the circuit 40 is at a logic level of "1", even when the potential of the gate of the transistor 42 is dropped from the potential of the signal containing the data input to the wirings BL by the threshold voltage of the transistor 41, the potential of the gate of the transistor 42 can be boosted because of the boosting effect. As a result, the transistor serving as a switch can be turned on and the switching speed of the circuit 40 can be increased. Furthermore, the transistor 41 serving as a switch can be kept off when the potential is at a logic level of "0".

<Configuration Example of Memory Circuit>

Next, a specific configuration example of the memory circuit 14 including the cell array 14a will be described.

Figure 6:
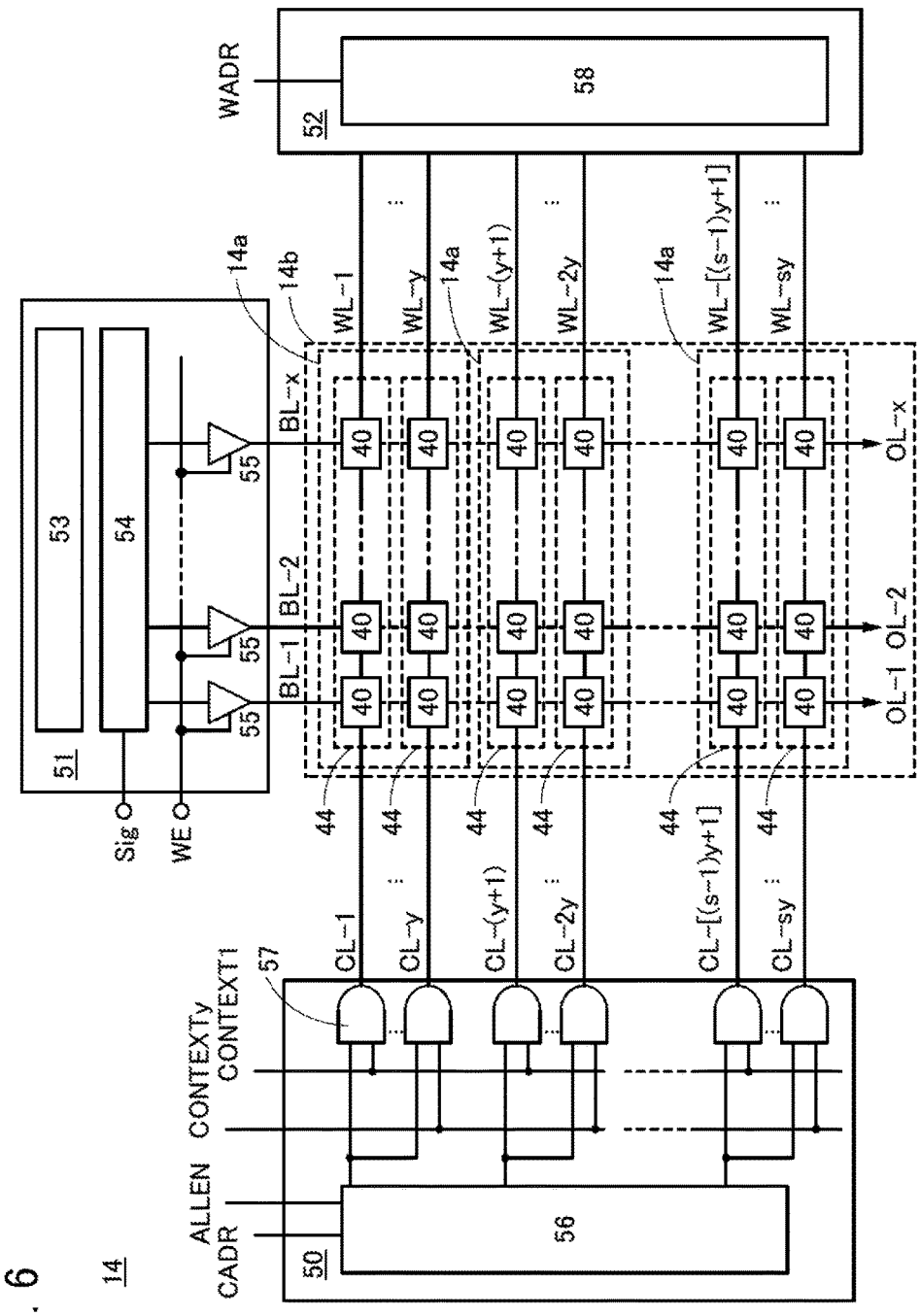
FIG. 6 illustrates a configuration example of a memory circuit.

The memory circuit 14 illustrated in FIG. 6 includes a cell array 14b having the cell arrays 14a, a driver circuit 50 that can supply potentials to the wirings CL, a driver circuit 51 that can supply signals containing data to the wirings BL, and a driver circuit 52 that can supply potentials to the wirings WL.

The driver circuit 51 includes a circuit 53, such as a shift register or a decoder, which can control timing of sampling of a signal Sig containing data; a circuit 54 which can perform sampling of the signal Sig at the timing determined by the circuit 53; and a plurality of switches 55 each of which can control supply of the sampled signal to wiring BL. FIG. 6 illustrates the case where a three-state buffer, the impedance of which is set high in accordance with a signal WE, is used as each of the switches 55.

Specifically, in FIG. 6, when the potential of the signal WE is at a high level, the switches 55 supply signals with the same logic levels as signals input to input terminals to the wirings BL. On the other hand, when the potential of the signal WE is at a low level, the switches 55 have high impedance and the signals input to the input terminals are not supplied to the wirings BL.

In the case where the memory circuit 14 is used as a set of a buffer memory device, the driver circuit 51 preferred to have a configuration with which data can be supplied to the cell array 14b in parallel across the data width of the buffer memory device as illustrated in FIG. 6.

The driver circuit 50 controls the potentials of the wirings CL to select one group 44 that determines the connection between the wiring PLEIN and the plurality of wirings OL, from the groups 44 included in each of the cell arrays 14a. Furthermore, the driver circuit 50 controls the potentials of the wirings CL to select one group 44 from which data is readout, from the groups 44 included in each of the cell arrays 14a.

The driver circuit 50 illustrated in FIG. 6 includes, specifically, a circuit 56 which generates a signal for selecting one cell array 14a from s cell arrays 14a (s is a natural number), and a plurality of circuits 57 which select one group 44 in the selected cell array 14a according to signals input to wirings CONTEXT1 to CONTEXTy. As the circuit 56, a decoder can be used, for example. As the circuits 57, AND circuits can be used, for example.

To select one group 44 from the groups 44, which are included in each of the cell arrays 14a storing data containing the circuit configuration data, in the driver circuit 50 illustrated in FIG. 6, the potentials of all signals output from the circuit 56 are set to high levels and the potential of only the wiring CONTEXT connected to the group 44 to be selected is set to a high level. Note that with the configuration illustrated in FIG. 6, whether the potentials of all the signals output from the circuit 56 are set to high levels is determined according to a potential supplied from a wiring ALLEN to the circuit 56.

When one group 44 is selected, the connection between the wiring PLEIN and the plurality of wirings OL can be determined. The switch 46 illustrated in FIG. 5 is turned on and the potential of the wiring 45 is supplied to the wiring PLEIN while one group 44 is selected by the driver circuit 50, whereby data of the selected group 44 can be output to wirings OL1 to OLx.

In the driver circuit 50 illustrated in FIG. 6, when a signal containing an address, which is supplied from a wiring CADR, is decoded by the circuit 56, one group from which data is read is selected from the groups 44.

The driver circuit 52 controls the potentials of wirings WL-1 to WL-sy to select one group to which data is input, from the groups 44 included in each of the cell arrays 14a. The driver circuit 52 illustrated in FIG. 6 includes, specifically, a circuit 58 which generates a signal for selecting one group 44 from the groups 44. As the circuit 58, a decoder can be used, for example. In addition, to select one group 44 to which data is input in the driver circuit 52 illustrated in FIG. 6, a signal containing an address, which is supplied from a wiring WADR, is decoded by the circuit 58.

<Operation Example of Memory Circuit>

Next, an example of the operation of the memory circuit 14 illustrated in FIG. 6 will be described with reference to a timing chart in FIG. 7.

First, the operation of the memory circuit 14 in periods T1 to T4 is described. In the periods T1 to T4, data containing circuit configuration data is stored in the memory circuit 14.

Figure 7:
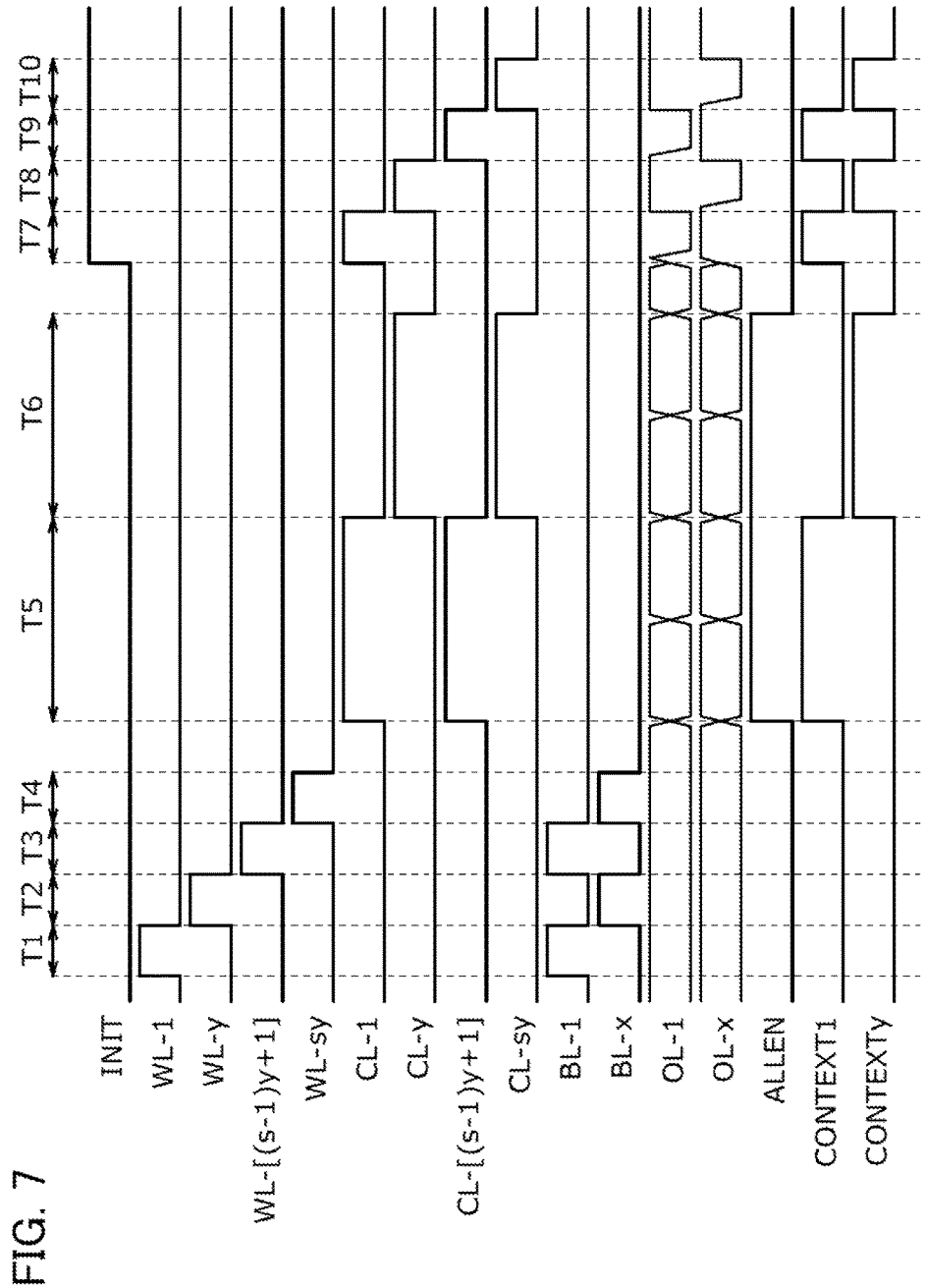
FIG. 7 is a timing chart.

Although not shown in FIG. 7, all data stored in the circuits 40 can be set to "0" immediately after the supply of power supply voltage to the integrated circuit 12. Specifically, the potentials supplied to the wirings WL-1 to WL-sy are all set to a high level and the potentials supplied to the wirings BL-1 to BL-x are all set to a low level, so that all data stored in the circuits 40 can be set to "0". In the above manner, an undesired short-circuit between the wirings OL-1 to OL-x through the circuits 40 can be avoided.

In the period T1, a signal containing an address (hereinafter, referred to as an address signal), which is supplied to the wiring WADR, is decoded by the circuit 58, so that a high-level potential is supplied to the wiring WL-1. Then, a high-level potential and a low-level potential are supplied to the wiring BL-1 and the wiring BL-x, respectively. Accordingly, data "1" is written to the circuit 40 in the first row and the first column, and data "0" is written to the circuit 40 in the first row and the x-th column.

In the period T2, the address signal which is supplied to the wiring WADR is decoded by the circuit 58, so that a high-level potential is supplied to the wiring WL-y. Then, a low-level potential and a high-level potential are supplied to the wiring BL-1 and the wiring BL-x, respectively. Accordingly, data "0" is written to the circuit 40 in the y-th row and the first column, and data "1" is written to the circuit 40 in the y-th row and the x-th column.

In the period T3, the address signal which is supplied to the wiring WADR is decoded by the circuit 58, so that a high-level potential is supplied to a wiring WL-[(s−1)y+1]. Then, a high-level potential and a low-level potential are supplied to the wiring BL-1 and the wiring BL-x, respectively. Accordingly, data "1" is written to the circuit 40 in the [(s−1)y+1]-th row and the first column, and data "0" is written to the circuit 40 in the [(s−1)y+1]-th row and the x-th column.

In the period T4, the address signal which is supplied to the wiring WADR is decoded by the circuit 58, so that a high-level potential is supplied to the wiring WL-sy. Then, a low-level potential and a high-level potential are supplied to the wiring BL-1 and the wiring BL-x, respectively. Accordingly, data "0" is written to the circuit 40 in the sy-th row and the first column, and data "1" is written to the circuit 40 in the sy-th row and the x-th column.

Next, the operation of the memory circuit 14 in periods T5 and T6 is described. In the periods T5 and T6, the integrated circuit 12 operates according to data stored in the memory circuit 14.

In the period T5, a high-level potential is supplied to the wiring ALLEN, so that high-level potentials are supplied from the circuit 56 to the circuits 57. Furthermore, in the period T5, a high-level potential and a low-level potential are supplied to the wiring CONTEXT1 and the wiring CONTEXTy, respectively. Accordingly, the wirings CL connected to the wiring CONTEXT1, such as the wiring CL-1, a wiring CL-(y+1), and a wiring CL-[(s−1)y+1], are selected; as a result, the groups 44 connected to the selected wirings CL are selected. According to data stored in the circuits 40 of the selected groups 44, the circuit configuration of the circuit 13a (illustrated in FIG. 3) is determined.

In the period T6, a high-level potential is supplied to the wiring ALLEN, so that high-level potentials are supplied from the circuit 56 to the circuits 57. Furthermore, in the period T6, a low-level potential and a high-level potential are supplied to the wiring CONTEXT1 and the wiring CONTEXTy, respectively. Accordingly, the wirings CL connected to the wiring CONTEXTy, such as the wiring CL-y, a wiring CL-2y, and a wiring CL-sy, are selected; as a result, the groups 44 connected to the selected wirings CL are selected. According to data stored in the circuits 40 of the selected groups 44, the circuit configuration of the circuit 13a (illustrated in FIG. 3) is determined.

Then, the operation of the memory circuit 14 in periods T7 to T10 is described. In the periods T7 to T10, the memory circuit 14 is used as a set associative buffer memory device together with the memory circuit 15 (illustrated in FIG. 3).

In the period T7, an address signal supplied to the wiring CADR is decoded by the circuit 56, a high-level potential is supplied to the wiring CONTEXT1, and a low-level potential is supplied to the wiring CONTEXTy; a high-level potential is supplied to the wiring CL-1. In addition, a high-level potential is supplied to the wiring NIT (illustrated in FIG. 5), so that a low-level potential is supplied from the wiring 45 (illustrated in FIG. 5) to the wiring PLEIN. After the output of the circuit 13a (FIG. 4) which supplies signals to the wirings OL-1 to OL-x is placed in a high impedance state, the potentials of the wirings OL-1 to OL-x are once set to high levels. Accordingly, data stored in the circuits 40 of the group 44 connected to the wiring CL-1 is output to the wirings OL-1 to OL-x. Note that although the timing chart in FIG. 7 is for describing the case where the potential of the wiring 45 illustrated in FIG. 5 is at a low level, the potential of the wiring 45 may be at a high level.

In the period T8, the address signal supplied to the wiring CADR is decoded by the circuit 56, a low-level potential is supplied to the wiring CONTEXT1, and a high-level potential is supplied to the wiring CONTEXTy; a high-level potential is supplied to the wiring CL-y. In addition, a high-level potential is supplied to the wiring NIT (illustrated in FIG. 5), so that a low-level potential is supplied from the wiring 45 (illustrated in FIG. 5) to the wiring PLEIN. After the output of the circuit 13a (FIG. 4) which supplies signals to the wirings OL-1 to OL-x is placed in a high impedance state, the potentials of the wirings OL-1 to OL-x are once set to high levels. Accordingly, data stored in the circuits 40 of the group 44 connected to the wiring CL-y is output to the wirings OL-1 to OL-x.

In the period T9, the address signal supplied to the wiring CADR is decoded by the circuit 56, a high-level potential is supplied to the wiring CONTEXT1, and a low-level potential is supplied to the wiring CONTEXTy; a high-level potential is supplied to the wiring CL-[(s−1)y+1]. In addition, a high-level potential is supplied to the wiring NIT (illustrated in FIG. 5), so that a low-level potential is supplied from the wiring 45 (illustrated in FIG. 5) to the wiring PLEIN. After the output of the circuit 13a (FIG. 4) which supplies signals to the wirings OL-1 to OL-x is placed in a high impedance state, the potentials of the wirings OL-1 to OL-x are once set to high levels. Accordingly, data stored in the circuits 40 of the group 44 connected to the wiring CL-[(s−1)y+1] is output to the wirings OL-1 to OL-x.

In the period T10, the address signal supplied to the wiring CADR is decoded by the circuit 56, a low-level potential is supplied to the wiring CONTEXT1, and a high-level potential is supplied to the wiring CONTEXTy; a high-level potential is supplied to the wiring CL-sy. In addition, a high-level potential is supplied to the wiring NIT (illustrated in FIG. 5), so that a low-level potential is supplied from the wiring 45 (illustrated in FIG. 5) to the wiring PLEIN. After the output of the circuit 13a (FIG. 4) which supplies signals to the wirings OL-1 to OL-x is placed in a high impedance state, the potentials of the wirings OL-1 to OL-x are once set to high levels. Accordingly, data stored in the circuits 40 of the group 44 connected to the wiring CL-sy is output to the wirings OL-1 to OL-x.

<Configuration Example 2 of Cell Array>

Next, a specific configuration example of the cell array 14a included in the memory circuit 14, which is different from that illustrated in FIG. 5, will be described.

Figure 8:
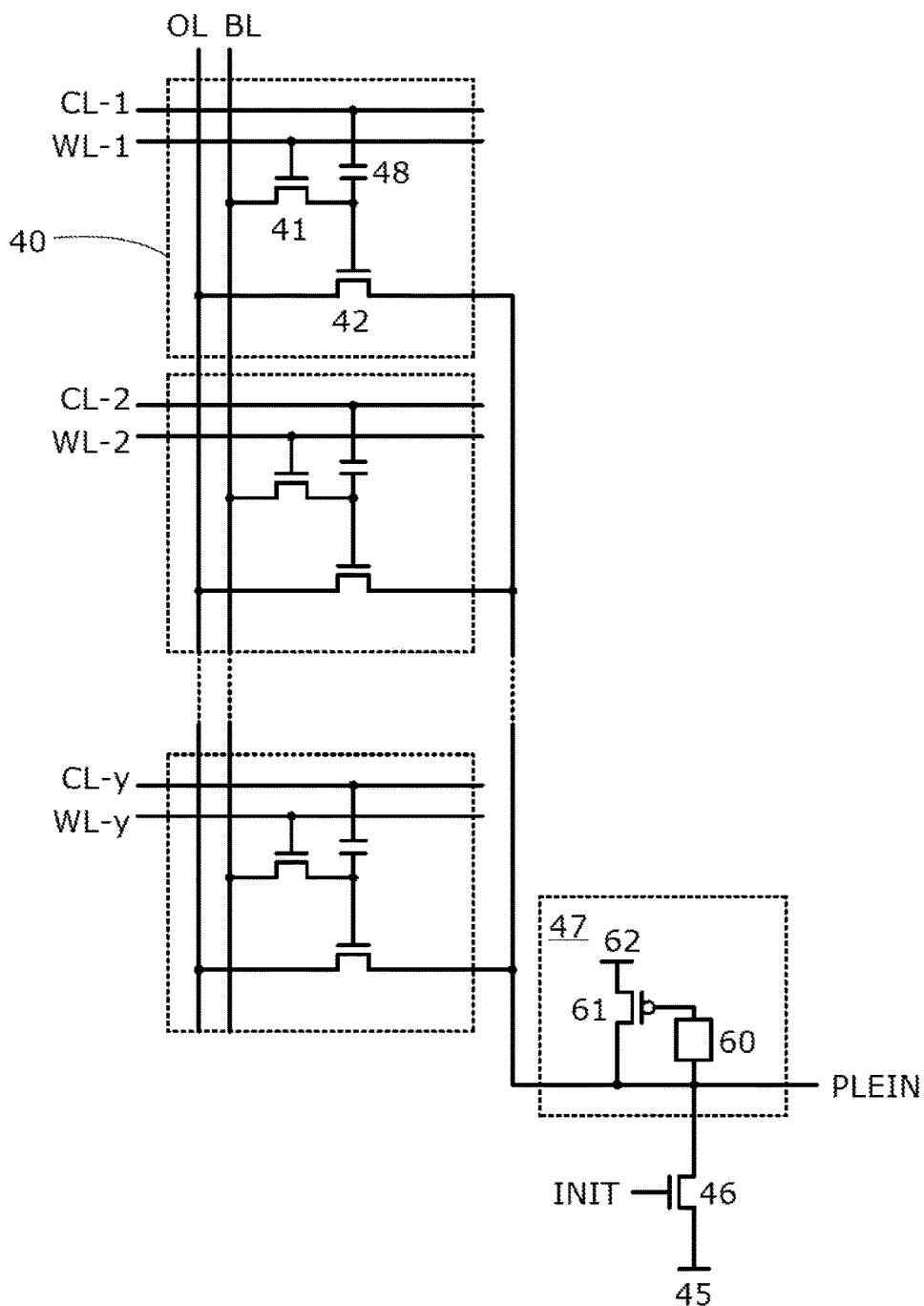
FIG. 8 illustrates a configuration example of a cell array.

The cell array 14a illustrated in FIG. 8 has the wiring BL, the wiring OL, the wiring PLEIN, the plurality of wirings WL represented as the wirings WL-1 to WL-y (y is a natural number greater than 1), and the plurality of wirings CL represented as the wirings CL-1 to CL-y. The cell array 14a illustrated in FIG. 8 also includes y circuits 40. Each of the circuits 40 includes at least the transistor 41, the transistor 42, and the capacitor 48.

Specifically, in the circuit 40 in the j-th row (j is a natural number less than y), the gate of the transistor 41 is electrically connected to the wiring WL-j. One of the source and the drain of the transistor 41 is electrically connected to the wiring BL and the other is electrically connected to the gate of the transistor 42. One of the source and the drain of the transistor 42 is electrically connected to the wiring OL and the other is electrically connected to the wiring PLEIN. One terminal of the capacitor 48 is electrically connected to the gate of the transistor 42 and the other terminal is electrically connected to the wiring CL-j.

Each of the circuits 40 may also include another circuit element such as a transistor, a diode, a resistor, a capacitor, an inductor, or the like as necessary.

In each of the circuits 40 included in the cell array 14a illustrated in FIG. 8, when the potential of a signal containing data is supplied to the wiring BL while the transistor 41 is on, the potential is supplied to the gate of the transistor 42 through the transistor 41. Then, the transistor 41 is turned off, whereby the potential supplied to the gate of the transistor 42 is retained. The capacitor 48 retains the potential of the gate of the transistor 42, and adds the amount of change in the potential of the wiring CL to the potential of the gate of the transistor 42 while keeping the gate of the transistor 42 floating. The transistor 42 is turned on/off according to the potential of the wiring CL and the potential of the gate which reflects the data.

When the transistor 42 is on, the wiring OL and the wiring PLEIN are electrically connected to each other. In the case where the transistor 42 is off, the wiring OL and the wiring PLEIN are electrically isolated from each other. This means that the connection between the wiring PLEIN and the plurality of wirings OL is determined according to the potential of the signal containing data stored in each of the circuits 40.

Each of the wirings OL is connected to one of the circuits 13 illustrated in FIG. 1 or FIG. 2, and the wiring PLEIN is connected to another one of the circuits 13. Accordingly, the connection between the circuits 13 is controlled according to the data stored in each of the circuits 40 in the cell array 14a.

The cell array 14a illustrated in FIG. 8 includes the switch 46 for controlling the connection between the wiring PLEIN and a wiring 45 to which a predetermined potential is applied. Even when the potential of the wiring PLEIN or the potential of the wiring OL is floating in a data storage period, the potential of the wiring PLEIN can be initialized to prevent a large amount of current from flowing between the wiring PLEIN and the plurality of wirings OL. This can prevent breakage of the memory circuit 14.

Note that in some cases, the potential of the wiring PLEIN becomes an intermediate potential, which is between a high-level potential and a low-level potential, in the data storage period. If the intermediate potential is applied to an input terminal of the circuit 13, a shoot-through current is likely to be generated in the circuit 13 connected to the wiring PLEIN. However, since the potential of the wiring PLEIN can be initialized as described above, the input terminal can be prevented from having the intermediate potential immediately after power is turned on; thus, generation of the shoot-through current can be prevented.

A latch may be electrically connected to the wiring PLEIN. In FIG. 8, in addition to the switch 46 for initialization, the latch 47 is electrically connected to the wiring PLEIN.

Note that the transistor 41 in the cell array 14a illustrated in FIG. 8 preferably has extremely small off-state current because the transistor 41 retains the potential of the gate of the transistor 42. A transistor in which a channel formation region is formed in a film of a semiconductor having a wider band gap and lower intrinsic carrier density than silicon can have extremely small off-state current and thus is preferably used as the transistor 41. Examples of such a semiconductor are an oxide semiconductor and gallium nitride that have a band gap more than twice as wide as that of silicon. A transistor including the semiconductor can have much smaller off-state current than a transistor including a normal semiconductor such as silicon or germanium. Consequently, the use of the transistor 41 having the above structure can prevent leakage of electric charge held at the gate of the transistor 42.

<Configuration Example 3 of Cell Array>

Next, a specific configuration example of the cell array 14a included in the memory circuit 14, which is different from that illustrated in FIG. 5 or FIG. 8, will be described.

Figure 9:
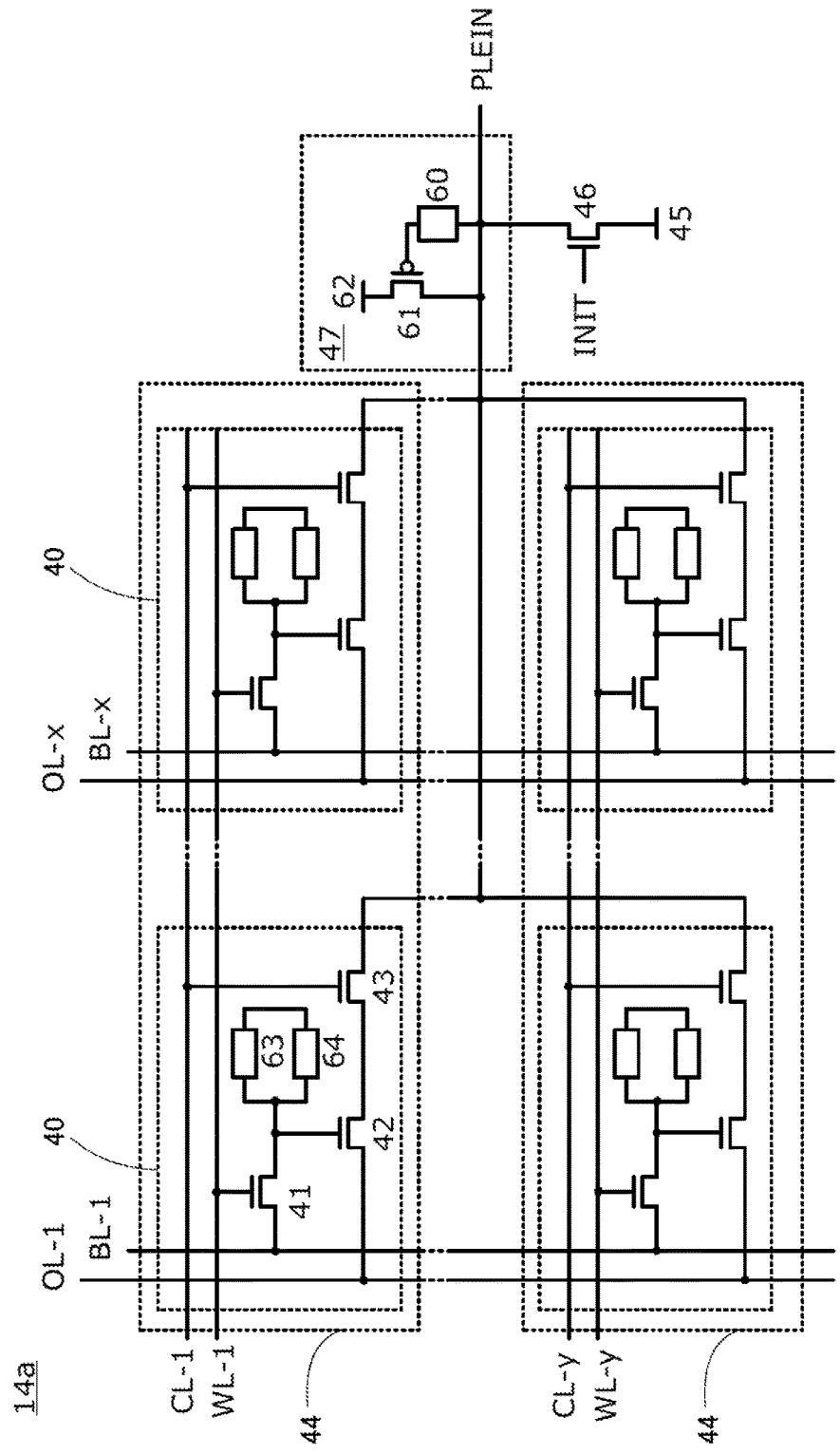
FIG. 9 illustrates a configuration example of a cell array.

Similarly to the cell array 14a in FIG. 5, the cell array 14a illustrated in FIG. 9 has the plurality of wirings BL represented as the wirings BL-1 to BL-x (x is a natural number greater than 1), the plurality of wirings OL represented as the wirings OL-1 to OL-x, the wiring PLEIN, the plurality of wirings WL represented as the wirings WL-1 to WL-y (y is a natural number greater than 1), and the plurality of wirings CL represented as the wirings CL-1 to CL-y. The cell array 14a illustrated in FIG. 9 also includes (x×y) circuits 40. Each of the circuits 40 includes at least the transistor 41, the transistor 42, and the transistor 43. The cell array 14a illustrated in FIG. 9 is different from the cell arrays 14a in FIGS. 5 and 8 in that a circuit 63 and a circuit 64 for retaining the potential of the gate of the transistor 42 are provided.

The circuits 63 and 64 invert the polarity of a potential and can be inverters or the like. Specifically, in FIG. 9, an input terminal of the circuit 63 and an output terminal of the circuit 64 are electrically connected to the gate of the transistor 42, and an output terminal of the circuit 63 and an input terminal of the circuit 64 are electrically connected to each other. Since each of the circuits 40 illustrated in FIG. 9 has the above configuration, the potential of the gate of the transistor 42 can be retained by the circuits 63 and 64.

Note that FIG. 9 shows the case where the transistor 43 is electrically connected between the other of the source and the drain of the transistor 42 and the wiring PLEIN. The transistor 43 may be electrically connected between one of the source and the drain of the transistor 42 and the wiring OL.

<Configuration Example of Integrated Circuit>

A specific configuration example of the integrated circuit 12 included in the semiconductor device 10 illustrated in FIGS. 1 and 2 will be described.

Figure 10A:
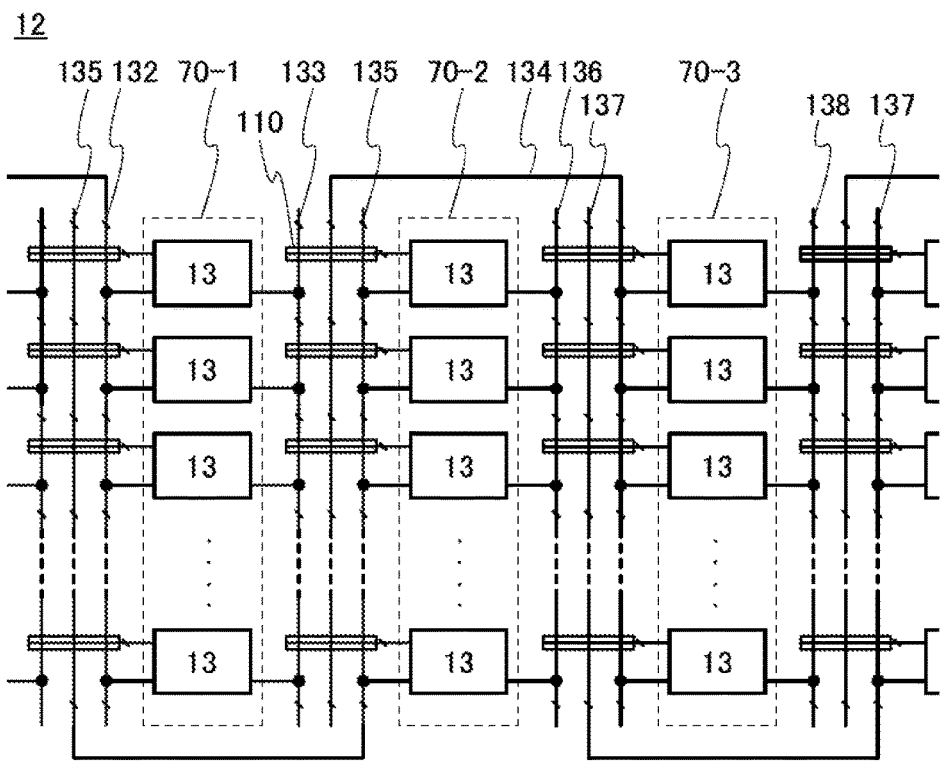
FIGS. 10A to 10C each illustrate a configuration example of a semiconductor device.

FIG. 10A illustrates a configuration example of the integrated circuit 12. In FIG. 10A, a first column 70-1, a second column 70-2, and a third column 70-3 each having the circuits 13 are provided in the integrated circuit 12. FIG. 10A illustrates an example where the first column 70-1, the second column 70-2, and the third column 70-3 are positioned in parallel in this order from the left.

In FIG. 10A, a plurality of wirings 132, a plurality of wirings 133, a plurality of wirings 134, a plurality of wirings 135, a plurality of wirings 136, a plurality of wirings 137, and a plurality of wirings 138 are provided in the integrated circuit 12.

A first output terminal of each circuit 13 in the first column 70-1 is electrically connected to one of the plurality of the wirings 132. A second output terminal of each circuit 13 in the first column 70-1 is electrically connected to one of the plurality of the wirings 133.

A first output terminal of each circuit 13 in the second column 70-2 is electrically connected to one of the plurality of the wirings 135. A second output terminal of each circuit 13 in the second column 70-2 is electrically connected to one of the plurality of the wirings 136.

A first output terminal of each circuit 13 in the third column 70-3 is electrically connected to one of the plurality of the wirings 134. A second output terminal of each circuit 13 in the third column 70-3 is electrically connected to one of the plurality of the wirings 138.

Note that the number of the first output terminals and the number of the second output terminals of each circuit 13 are not limited to one, and either or both of the number of the first output terminals and the number of the second output terminals may be more than one. Note also that one output terminal is always connected to one wiring regardless of the number of the first output terminals and the number of the second output terminals. Thus, when one column includes Y circuits 13 (Y is a natural number), the integrated circuit 12 at least includes Y wirings connected to the first output terminals and Y wirings connected to the second output terminals.

The first column 70-1 is placed between the plurality of the wirings 132 and the plurality of the wirings 133. The second column 70-2 is placed between the plurality of the wirings 135 and the plurality of the wirings 136. The third column 70-3 is placed between the plurality of the wirings 134 and the plurality of the wirings 138.

The plurality of the wirings 135, which are connected to the first output terminals of the circuits 13 in the second column 70-2, are provided both between the first column 70-1 and the second column 70-2 and between the first column 70-1 and a column (not illustrated) of the circuits 13 positioned on the left side of the first column 70-1 in FIG. 10A. The plurality of the wirings 134, which are connected to the first output terminals of the circuits 13 in the third column 70-3, are provided both between the first column 70-1 and the second column 70-2 and between the second column 70-2 and the third column 70-3. The plurality of the wirings 137 connected to first output terminals of the circuits 13 (not illustrated) positioned on the right side of the third column 70-3 in FIG. 10A are provided both between the second column 70-2 and the third column 70-3 and between the third column 70-3 and a column (not illustrated) of the circuits 13 positioned on the right side of the third column 70-3.

When attention is focused on an N-th column (N is a natural number of 3 or more), a plurality of wirings connected to first output terminals of the circuits 13 in the N-th column are provided both between the N-th column and an (N−1)-th column and between the (N−1)-th column and an (N−2)-th column. In the case where N is 2, a plurality of wirings electrically connected to the first output terminals of the circuits 13 in the second column are provided both between the second column and the first column and between the first column and an IO. The IO has a function of an interface that controls input of signals to the circuits 13 from the outside of the integrated circuit 12 or output of signals from the circuits 13 to the outside of the integrated circuit 12.

In one embodiment of the present invention, when attention is focused on the (N−1)-th column (N is a natural number of 3 or more), a plurality of wirings electrically connected to first output terminals of the circuits 13 in the (N−1)-th column, a plurality of wirings electrically connected to the first output terminals of the circuits 13 in the N-th column, and a plurality of wirings electrically connected to second output terminals of the circuits 13 in the (N−2)-th column are electrically connected to a plurality of input terminals of the circuits 13 in the (N−1)-th column through circuits 110.

Specifically, in FIG. 10A, for example, the plurality of the wirings 135 electrically connected to the first output terminals of the circuits 13 in the second column 70-2, the plurality of the wirings 134 electrically connected to the first output terminals of the circuits 13 in the third column 70-3, and the plurality of the wirings 133 electrically connected to the second output terminals of the circuits 13 in the first column 70-1 are electrically connected to a plurality of input terminals of the circuits 13 in the second column 70-2 through the circuits 110.

Figure 10B:
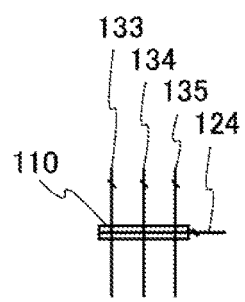

FIG. 10B is a circuit diagram of the circuit 110 that controls an electrical connection between the plurality of the wirings 133, the plurality of the wirings 134, and the plurality of the wirings 135 and the plurality of the input terminals of the circuits 13 in the second column 70-2 illustrated in FIG. 1 OA. A plurality of wirings 124 in FIG. 10B are electrically connected to the plurality of the input terminals of the circuits 13 in the second column 70-2.

Figure 10C:
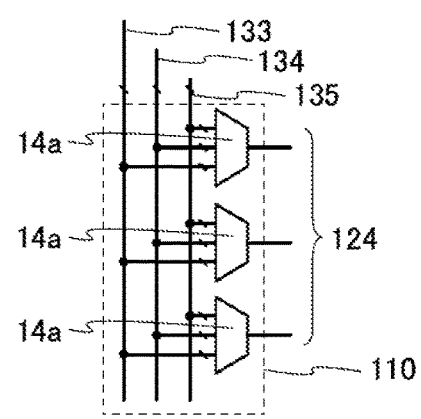

The circuit 110 includes a plurality of the cell arrays 14a illustrated in FIG. 5, FIG. 8, or FIG. 9. FIG. 10C illustrates a specific configuration example of the circuit 110 illustrated in FIG. 10B. As illustrated in FIG. 10C, the circuit 110 in FIG. 10B includes three cell arrays 14a.

Note that since the circuit 110 includes three wirings 124 in FIG. 10C, the circuit 110 includes three cell arrays 14a. The number of the cell arrays 14a included in the circuit 110 can be determined according to the number of input terminals of the circuit 13.

FIGS. 10B and 10C illustrate the circuit 110, as a typical example, that controls the electrical connection between the pluralities of the wirings 133, 134, and 135 and the plurality of the wirings 124; another circuit 110 that controls an electrical connection between plural wirings and plural wirings in FIG. 10A has a structure similar to the above structure.

Figure 11:
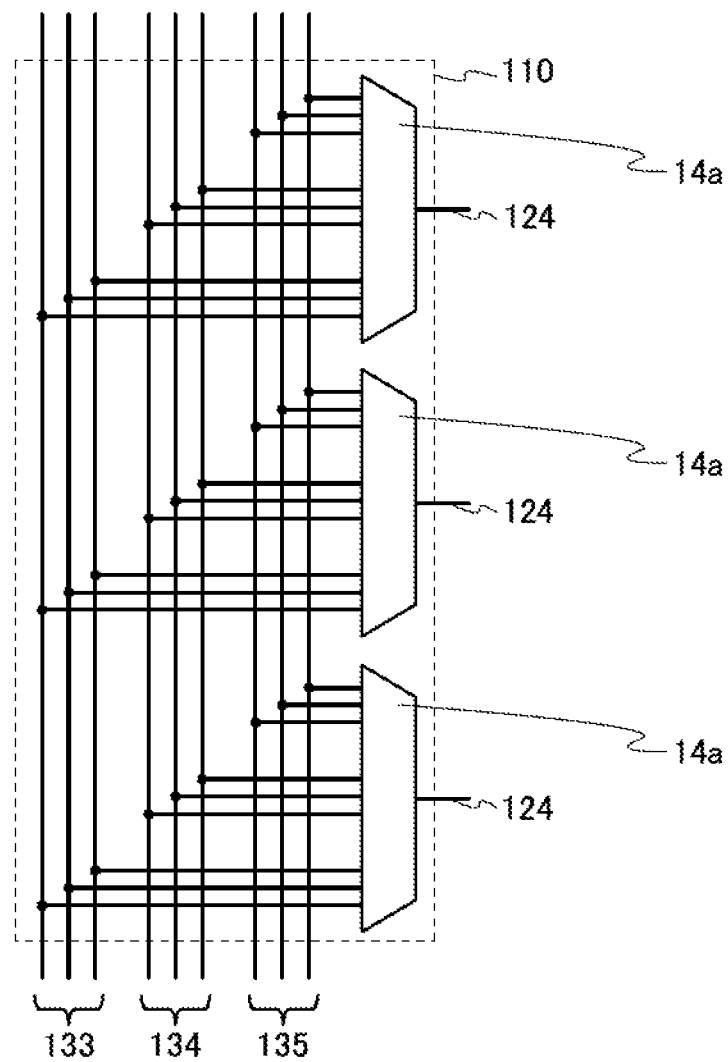
FIG. 11 illustrates a specific configuration example of a circuit.

FIG. 11 illustrates a more specific structural example of the circuit 110 in FIG. 10C. FIG. 11 more specifically shows a connection relation between the plurality of the wirings 133, the plurality of the wirings 134, and the plurality of the wirings 135 and the circuit 110. As illustrated in FIG. 11, each of the cell arrays 14a controls the connection between all the pluralities of the wirings 133, 134, and 135 and one of the plurality of the wirings 124.

In the case where the cell array 14a illustrated in FIG. 5, FIG. 8, or FIG. 9 is used in the circuit 110 in FIG. 11, the plurality of wirings 133, the plurality of wirings 134, and the plurality of wirings 135 illustrated in FIG. 11 correspond to the wirings OL-1 to OL-x in FIG. 5, and each of the wirings 124 illustrated in FIG. 11 corresponds to the wiring PLEIN in FIG. 5.

As described above, in one embodiment of the present invention, one of a plurality of wirings electrically connected to the output terminal of the circuit 13, such as the wirings 133, 134, and 135, is selected according to data stored in the circuit 40, and the one selected wiring and another wiring electrically connected to the input terminal of another circuit 13, such as the wiring 124, are electrically connected by the cell array 14a. Furthermore, in one embodiment of the present invention, the circuits 110 including the cell arrays 14a with the above configuration and the aforementioned various wirings whose continuities are controlled by the circuits 110 are provided between columns having the circuits 13, such as the first column 70-1, the second column 70-2, and the third column 70-3; thus, in the integrated circuit 12 illustrated in FIG. 10A, the continuity between two circuits 13 in the second column 70-2 can be controlled by one cell array 14a. In addition, the continuity between one of the circuits 13 in the first column 70-1 and one of the circuits 13 in the second column 70-2 can be controlled by one cell array 14a. Moreover, the continuity between one of the circuits 13 in the second column 70-2 and one of the circuits 13 in the third column 70-3 can be controlled by one cell array 14a. Thus, one embodiment of the present invention can achieve the integrated circuit 12 that needs a small number of switches to control the continuities between the circuits 40 while having high design flexibility.

<Configuration Example of Circuit>

Next, the configuration example of the circuit 13 included in the integrated circuit will be described.

Figure 12A:
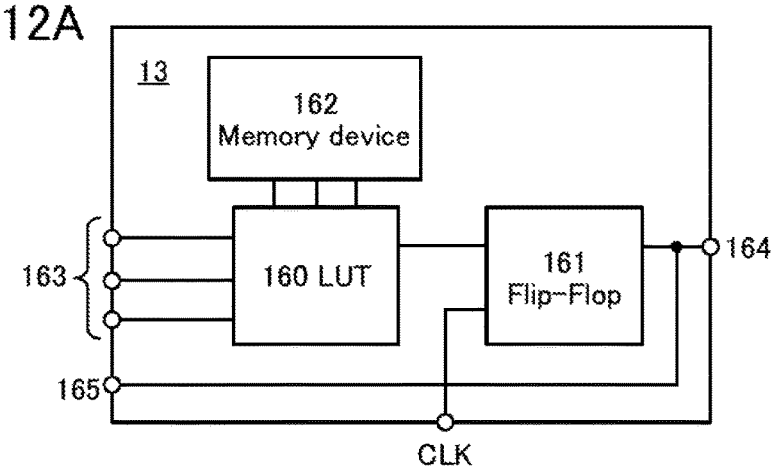
FIGS. 12A to 12C each illustrate a specific configuration example of a circuit.

FIG. 12A illustrates one embodiment of the circuit 13. The circuit 13 illustrated in FIG. 12A includes a look-up table (LUT) 160, a flip-flop 161, and a memory device 162. The kind of logic operation of the LUT 160 is determined according to data stored in the memory device 162. Specifically, in the LUT 160, the logical value of an output signal with respect to the logical values of input signals supplied to input terminals 163 is determined according to the data. Then, the LUT 160 outputs a signal containing the logical value of the output signal. The flip-flop 161 holds the signal output from the LUT 160 and outputs an output signal corresponding to the signal output from the LUT 160 in synchronization with a signal CLK, from a first output terminal 164 and a second output terminal 165.

Note that the circuit 13 may also include a multiplexer to select whether the output signal from the LUT 160 passes through the flip-flop 161.

The type of the flip-flop 161 may be determined by data. Specifically, the flip-flop 161 may have a function of any of a D flip-flop, a T flip-flop, a JK flip-flop, and an RS flip-flop depending on the data.

Figure 12B:
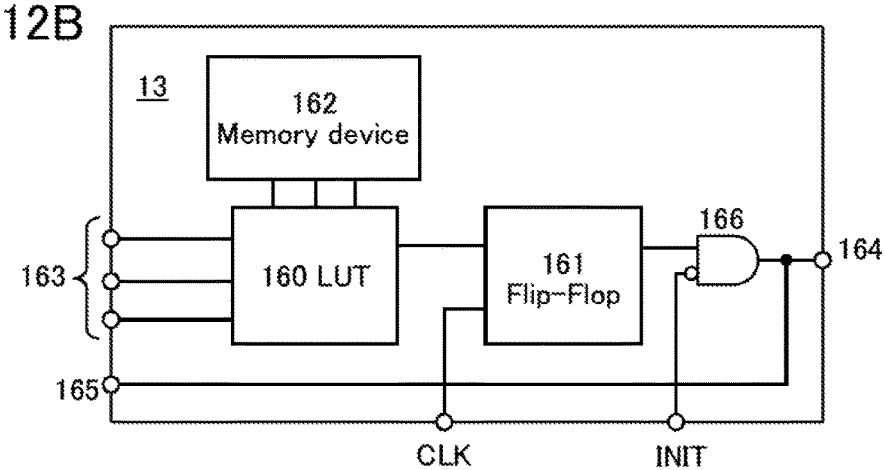

FIG. 12B illustrates another embodiment of the circuit 13. The circuit 13 illustrated in FIG. 12B includes an AND circuit 166 in addition to the components of the circuit 13 in FIG. 12A. To the AND circuit 166, a signal from the flip-flop 161 is supplied as an active high input, and the potential of the wiring NIT for initializing the potential of the wiring PLEIN (illustrated in FIG. 5, FIG. 8, or FIG. 9) is supplied as an active low input. With the above configuration, when the potential of the wiring PLEIN is initialized according to the potential of the wiring NIT, a wiring to which an output signal from the circuit 13 is supplied can be initialized with the use of the potential of the wiring 45 (illustrated in FIG. 5, FIG. 8, or FIG. 9). Consequently, a large amount of current can be prevented from flowing between the circuits 13, so that breakage of the integrated circuit 12 can be prevented.

Figure 12C:
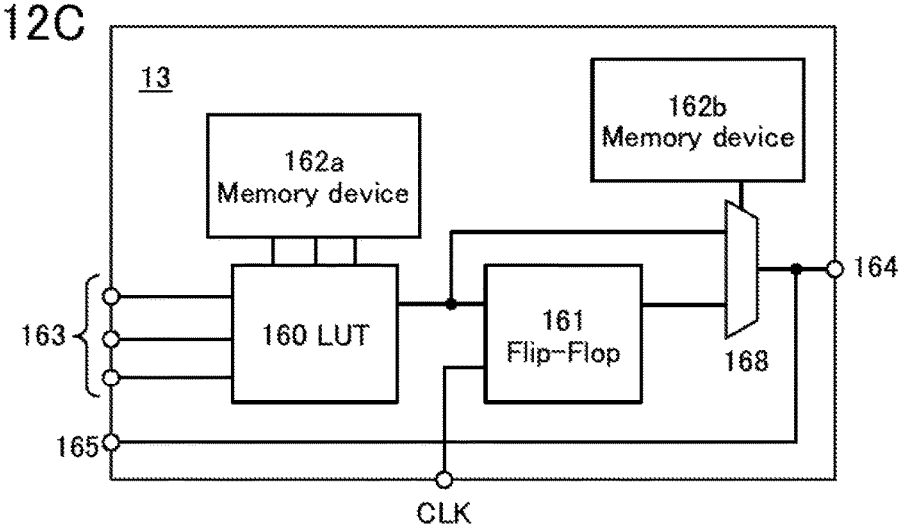

FIG. 12C illustrates another mode of the circuit 13. The circuit 13 in FIG. 12C has a structure in which a multiplexer 168 is added to the circuit 13 in FIG. 12A. The circuit 13 in FIG. 12C further includes two memory devices 162 (memory devices 162a and 162b). The kind of logic operation of the LUT 160 is determined in accordance with data of the memory device 162a. A signal output from the LUT 160 and a signal output from the flip-flop 161 are input to the multiplexer 168. The multiplexer 168 has functions of selecting and outputting one of the two output signals in accordance with data stored in the memory device 162b. The signal output from the multiplexer 168 is output from the first output terminal 164 and the second output terminal 165.

<Structural Example of Semiconductor Device>

Figure 13:
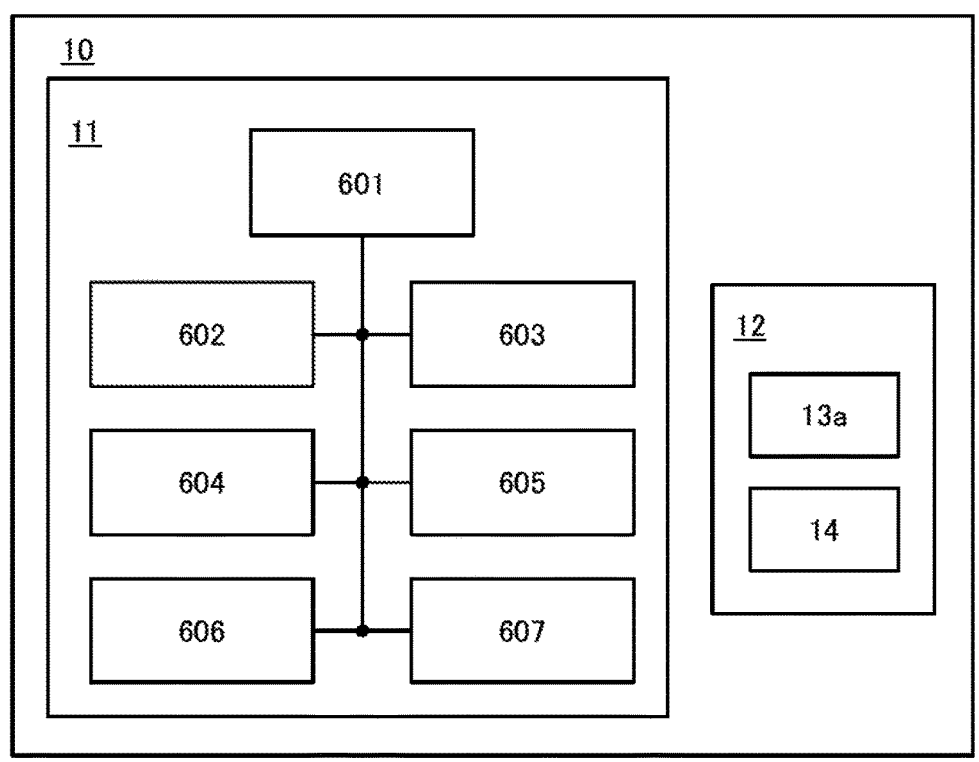
FIG. 13 illustrates the configuration of a processor.

A specific configuration example of the semiconductor device 10 of one embodiment of the present invention is described. FIG. 13 is a block diagram showing a configuration example of the semiconductor device 10.

The semiconductor device 10 illustrated in FIG. 13 includes the integrated circuit 11 and the integrated circuit 12. The integrated circuit 11 includes a control unit 601, an arithmetic unit 602, a main memory 603, an input device 604, an output device 605, an interface (IF) 606, and a buffer memory device 607. The integrated circuit 12 includes the circuit 13a and the memory circuit 14.

The control unit 601 has a function of collectively controlling operations of the arithmetic unit 602, the main memory 603, the input device 604, the output device 605, the IF 606, and the buffer memory device 607 included in the semiconductor device 10 to decode and execute an input instruction included in a program such as an application. The arithmetic unit 602 has a function of performing a variety of arithmetic processing such as four arithmetic operations and logic operations.

Although FIG. 13 illustrates the control unit 601 and the arithmetic unit 602 as independent blocks, the semiconductor device 10 may include a central processing unit having both the function of the control unit 601 and the function of the arithmetic unit 602, instead of the control unit 601 and the arithmetic unit 602.

The main memory 603 has a function of storing a program such as an application including a plurality of instructions, which is executed by the control unit 601, and data used for arithmetic processing performed by the arithmetic unit 602.

The buffer memory device 607 has a function of storing data obtained during arithmetic processing performed by the arithmetic unit 602, data obtained as a result of performing arithmetic processing by the arithmetic unit 602, and the like. The buffer memory device 607 may have a function of temporarily storing a program such as an application.

The input device 604 has a function of sending an instruction input from the outside of the semiconductor device to the semiconductor device 10. As the input device 604, for example, a keyboard, a mouse, a touch panel, or the like can be used.

The output device 605 has a function of outputting an operation state of the semiconductor device 10, a result obtained by execution of a program such as an application, or the like as information. As the output device 605, for example, a display, a projector, a printer, a plotter, an audio output device, or the like can be used.

The IF 606 is a data path between the integrated circuit 11 and the integrated circuit 12. Specifically, a test pattern generated in the circuit 13a is sent to the integrated circuit 11 through the IF 606. In addition, a signal obtained when the integrated circuit 11 operates according to the test pattern is sent to the circuit 13a through the IF 606. In the case where the memory circuit 14 functions as a set associative buffer memory device together with the buffer memory device 607, the memory circuit 14 and the buffer memory device 607 store data acquired during or a result of arithmetic processing by the arithmetic unit 602, for example. The memory circuit 14 may temporarily store a program such as an application.

Execution of an instruction is repeated in the control unit 601, whereby a program is executed.

<Transistor>

In the semiconductor device of one embodiment of the present invention, when the off-state current of the transistor 41 illustrated in FIG. 5 or FIG. 8 is small, the data retention time can be lengthened. Thus, the transistor 41 preferably has a channel formation region in an oxide semiconductor film.

Figure 15A:
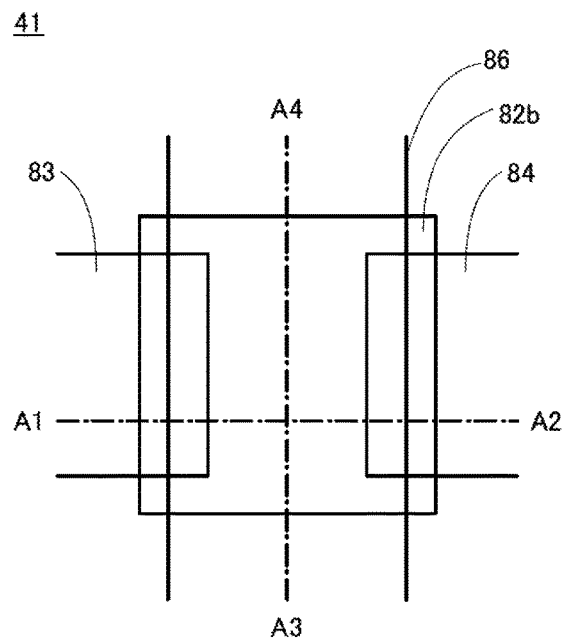
FIGS. 15A to 15C illustrate a structure of a transistor.
Figure 15C:
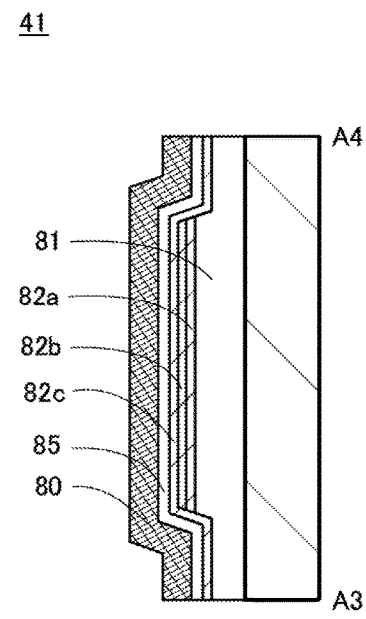
Figure 15B:
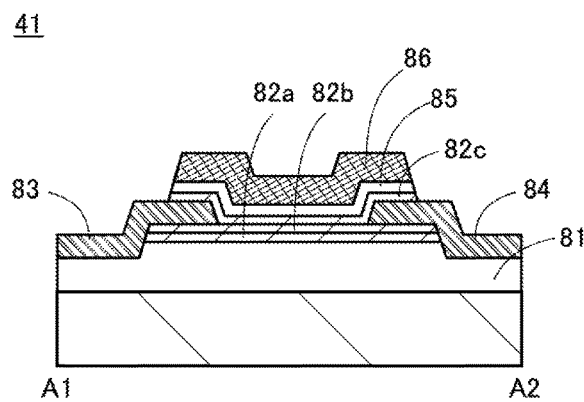

FIGS. 15A to 15C illustrate a structure example of the transistor 41 having a channel formation region in an oxide semiconductor film. FIG. 15A is a top view of the transistor 41. Note that insulating films are not illustrated in FIG. 15A in order to clarify the layout of the transistor 41. FIG. 15B is a cross-sectional view along the dashed line A1-A2 in the top view in FIG. 15A. FIG. 15C is a cross-sectional view along the dashed line A3-A4 in the top view in FIG. 15A.

As illustrated in FIGS. 15A to 15C, the transistor 41 includes an oxide semiconductor film 82a and an oxide semiconductor film 82b that are stacked in this order over an insulating film 81; a conductive film 83 and a conductive film 84 that are electrically connected to the oxide semiconductor film 82b and function as a source electrode and a drain electrode; an oxide semiconductor film 82c over the oxide semiconductor film 82b, the conductive film 83, and the conductive film 84; an insulating film 85 that functions as a gate insulating film and is located over the oxide semiconductor film 82c; and a conductive film 86 that functions as a gate electrode, lies over the insulating film 85, and overlaps with the oxide semiconductor films 82a to 82c.

Figure 16A:
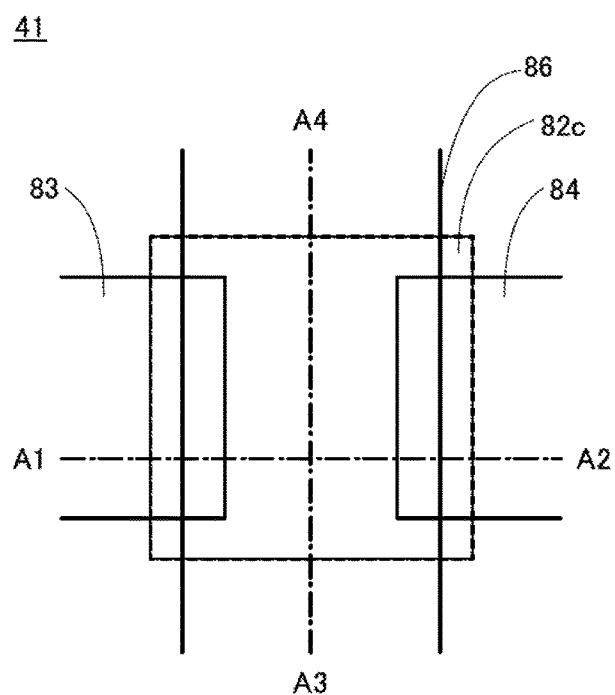
FIGS. 16A to 16C illustrate a structure of a transistor.
Figure 16C:
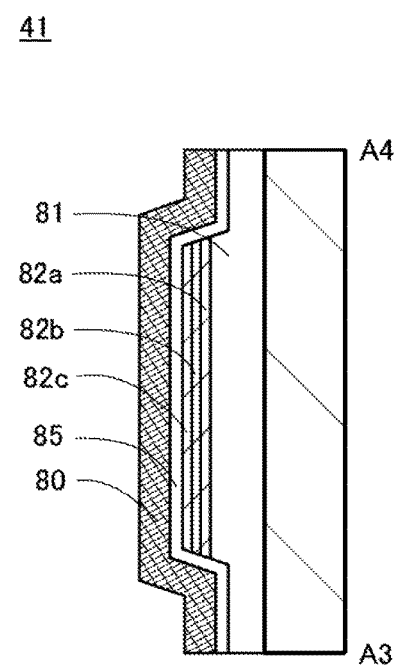
Figure 16B:
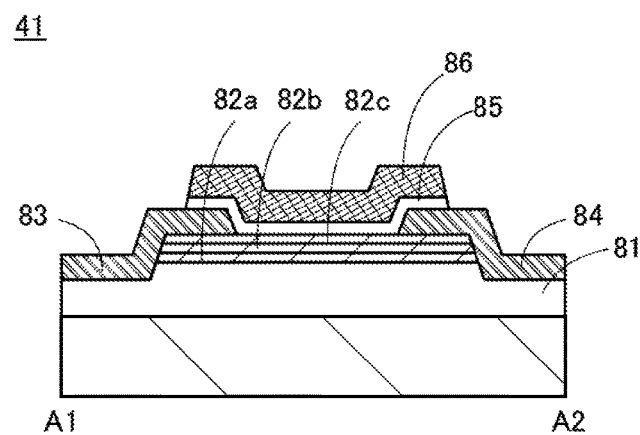

FIGS. 16A to 16C illustrates another specific example of the structure of the transistor 41. FIG. 16A is a top view of the transistor 41. Note that insulating films are not illustrated in FIG. 16A in order to clarify the layout of the transistor 41. FIG. 16B is a cross-sectional view along the dashed line A1-A2 in the top view in FIG. 16A. FIG. 16C is a cross-sectional view along the dashed line A3-A4 in the top view in FIG. 16A.

As illustrated in FIGS. 16A to 16C, the transistor 41 includes the oxide semiconductor films 82a to 82c that are stacked in this order over the insulating film 81; the conductive films 83 and 84 that are electrically connected to the oxide semiconductor film 82c and function as a source electrode and a drain electrode; the insulating film 85 that functions as a gate insulating film and is located over the oxide semiconductor film 82c, the conductive film 83, and the conductive film 84; and the conductive film 86 that functions as a gate electrode, is over the insulating film 85, and overlaps with the oxide semiconductor films 82a to 82c.

FIGS. 15A to 15C and FIGS. 16A to 16C each illustrate the structure example of the transistor 41 in which the oxide semiconductor films 82a to 82c are stacked. However, the structure of the oxide semiconductor film included in the transistor 41 is not limited to a stacked-layer structure including a plurality of oxide semiconductor films and may be a single-layer structure.

In the case where the transistor 41 includes the semiconductor film consisting of the semiconductor films 82a to 82c stacked in this order, each of the oxide semiconductor films 82a and 82c is an oxide film that contains at least one of metal elements contained in the oxide semiconductor film 82b and in which energy at the conduction band minimum is closer to the vacuum level than that in the oxide semiconductor film 82b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 82b preferably contains at least indium because carrier mobility is increased.

In the case where the transistor 41 includes the semiconductor films with the above structure, when an electric field is applied to the semiconductor films by applying voltage to the gate electrode, a channel region is formed in the oxide semiconductor film 82b, which has the lowest conduction band minimum among the semiconductor films. That is, since the oxide semiconductor film 82c is provided between the oxide semiconductor film 82b and the insulating film 85, a channel region can be formed in the oxide semiconductor film 82b, which is separated from the insulating film 85.

Since the oxide semiconductor film 82c contains at least one of metal elements contained in the oxide semiconductor film 82b, interface scattering is unlikely to occur at the interface between the oxide semiconductor film 82b and the oxide semiconductor film 82c. Thus, the movement of carriers is unlikely to be inhibited at the interface, which results in an increase in the field-effect mobility of the transistor 41.

When an interface state is formed at an interface between the oxide semiconductor films 82b and 82a, a channel region is also formed in a region close to the interface; thus, the threshold voltage of the transistor 41 varies. However, since the oxide semiconductor film 82a contains at least one of metal elements contained in the oxide semiconductor film 82b, an interface state is unlikely to be formed at the interface between the oxide semiconductor film 82b and the oxide semiconductor film 82a. Accordingly, the above structure allows reducing of variations in electrical characteristics of the transistor 41, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous energy band, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5\times10^{-7}$ Pa to $1\times10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 82b is an In-M-Zn oxide film (M is Ga, Y, Zr, La, Ce, or Nd) and a target having the atomic ratio of metal elements of In:M:Zn=$x_1$:$y_1$:$z_1$ is used for forming the oxide semiconductor film 82b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 82b is easily formed. Typical examples of the atomic ratio of the metal elements of the target are In:M:Zn=1:1:1 and In:M:Zn=3:1:2.

Specifically, in the case where the oxide semiconductor film 82a and the oxide semiconductor film 82c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 82a and 82c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 82a and 82c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 82a and the oxide semiconductor film 82c each have a thickness of more than or equal to 3 nm and less than or equal to 100 nm, preferably more than or equal to 3 nm and less than or equal to 50 nm. The thickness of the oxide semiconductor film 82b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 82a to 82c can be either amorphous or crystalline. Note that the oxide semiconductor film 82b in which a channel region is formed preferably has a crystalline structure, in which case the transistor 41 can have stable electrical characteristics.

Note that a channel formation region refers to a region of a semiconductor film of the transistor 41 that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 82a and 82c, the oxide semiconductor films 82a and 82c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor film 82b is a CAAC-OS film, the oxide semiconductor film 82b is preferably deposited with the use of a polycrystalline In—Ga—Zn oxide target containing In, Ga, and Zn in an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 82a to 82c can be formed by a sputtering method, they may be formed by another method, e.g., a thermal CVD method. A metal organic chemical vapor deposition (MOCVD) method or an atomic layer deposition (ALD) method may be employed as an example of a thermal CVD method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor film. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In that case, it can be seen that off-state current of the transistor normalized on the channel width is lower than or equal to 100 zA/μm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charges of the capacitor per unit hour. As a result, it can be seen that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included as an oxide semiconductor. In addition, as a stabilizer for reducing variations in electric characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio between In, Ga, and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 41, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 41, achieving the high-speed operation of a semiconductor device using the transistor 41.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. Examples of such a conductive material include Al, Cr, Cu, Ta, Ti, Mo, and W.

Furthermore, in the case where the semiconductor film including the stacked oxide semiconductor films is used in the transistor 41, the n-type region preferably extends to the oxide semiconductor film 82b serving as a channel region in order that the mobility and on-state current of the transistor 41 can be further increased and the semiconductor device can operate at higher speed.

The insulating film 81 preferably has a function of supplying oxygen to the oxide semiconductor films 82a to 82c by heating. It is preferable that the number of defects in the insulating film 81 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 81, which has a function of supplying oxygen to the oxide semiconductor films 82a to 82c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 81 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 41 illustrated in FIGS. 15A to 15C or FIGS. 16A to 16C, the conductive film 86 overlaps with end portions of the oxide semiconductor film 82b including a channel region that do not overlap with the conductive films 83 and 84, i.e., end portions of the oxide semiconductor film 82b that are in a region different from a region where the conductive films 83 and 84 are located. When the end portions of the oxide semiconductor film 82b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the conductive film 86 because the end portions of the oxide semiconductor film 82b that do not overlap with the conductive films 83 and 84 overlap with the conductive film 86 in the transistor 41 illustrated in FIGS. 15A to 15C or FIGS. 16A to 16C. Consequently, current that flows between the conductive films 83 and 84 through the end portions of the oxide semiconductor film 82b can be controlled by the potential applied to the conductive film 86. Such a structure of the transistor 41 is referred to as a surrounded channel (s-channel) structure.

With the s-channel structure, specifically, when a potential at which the transistor 41 is turned off is supplied to the conductive film 86, the amount of off-state current that flows between the conductive films 83 and 84 through the end portions can be reduced. For this reason, in the transistor 41, even when the distance between the conductive films 83 and 84 at the end portions of the oxide semiconductor film 82b is reduced as a result of reducing the channel length to obtain high on-state current, the transistor 41 can have low off-state current. Consequently, with the short channel length, the transistor 41 can have high on-state current when in an on state and low off-state current when in an off state.

With the s-channel structure, specifically, when a potential at which the transistor 41 is turned on is supplied to the conductive film 86, the amount of current that flows between the conductive films 83 and 84 through the end portions of the oxide semiconductor film 82b can be increased. The current contributes to an increase in the field-effect mobility and the on-state current of the transistor 41. When the end portions of the oxide semiconductor film 82b overlap with the conductive film 86, carriers flow in a wide region of the oxide semiconductor film 82b without being limited to a region in the vicinity of the interface between the oxide semiconductor film 82b and the insulating film 85, which results in an increase in carrier mobility the transistor 41. As a result, the on-state current of the transistor 41 is increased, and the field-effect mobility is increased to greater than or equal to 10 $cm^2/V \cdot s$ or to greater than or equal to 20 $cm^2/V \cdot s$, for example. Note that here, the field-effect mobility is not an approximate value of the mobility as the physical property of the oxide semiconductor film but is an index of current drive capability and the apparent field-effect mobility of a saturation region of the transistor.

A structure of the oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "substantially perpendicular" indicates that the angle formed between two straight lines is greater than or equal to 80° and less than or equal to 100°, and accordingly includes the case where the angle is greater than or equal to 85° and less than or equal to 95°. In addition, the term "substantially perpendicular" indicates that the angle formed between two straight lines is greater than or equal to 60° and less than or equal to 120°. In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a CAAC-OS, a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

When a combined analysis image (also referred to as a high-resolution TEM image) of a bright-field image and a diffraction pattern of the CAAC-OS film is observed by a transmission electron microscope (TEM), a plurality of crystal parts are seen. However, a boundary between crystal parts, that is, a grain boundary is not clearly observed even in the high-resolution TEM image. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In a high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film including an $InGaZnO_4$ crystal is analyzed by an out-of-plane method, a peak may also be observed at 2θ of around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has a higher strength of bonding to oxygen than that of a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor using the oxide semiconductor film rarely has negative threshold voltage (is rarely normally on). The highly purified intrinsic or substantially highly purified intrinsic oxide semiconductor film has few carrier traps. Accordingly, the transistor using the oxide semiconductor film has little change in electrical characteristics and high reliability. Electrical charges trapped by the carrier traps in the oxide semiconductor film take a long time to be released, and might behave like fixed electrical charges. Thus, the transistor that uses the oxide semiconductor film having high impurity concentration and a high density of defect states has unstable electrical characteristics in some cases.

With the use of the CAAC-OS film in a transistor, a change in the electrical characteristics of the transistor due to irradiation with visible light or ultraviolet light is small.

Next, a microcrystalline oxide semiconductor film is described.

A microcrystalline oxide semiconductor film has a region where a crystal part can be found in the high-resolution TEM image and a region where a crystal part cannot be found clearly in the high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film that is obtained by using an electron beam having a probe diameter (e.g., larger than or equal to 50 nm) larger than the diameter of a crystal part. Meanwhile, spots are observed in a nanobeam electron diffraction pattern of the nc-OS film that is obtained by using an electron beam having a probe diameter close to, or smaller than the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are observed in a ring-like region in some cases.

The nc-OS film is an oxide semiconductor film having more regularity than an amorphous oxide semiconductor film; thus, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state like quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

Furthermore, the density of an oxide semiconductor varies depending on the structure in some cases. For example, when the composition of an oxide semiconductor film is determined, the structure of the oxide semiconductor can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor having a density of lower than 78% of the density of the single crystal oxide semiconductor film.

Specific examples of the above description are given. For example, in an oxide semiconductor film in which the atomic ratio of In to Ga and Zn is 1:1:1, the density of a single crystal of InGaZnO$_4$ with a rhombohedral crystal structure is 6.357 g/cm$^3$. Accordingly, in the oxide semiconductor film in which the atomic ratio of In to Ga and Zn is 1:1:1, the density of the a-like OS film is higher than or equal to 5.0 g/cm$^3$ and lower than 5.9 g/cm$^3$, and the density of the nc-OS film and the CAAC-OS film is higher than or equal to 5.9 g/cm$^3$ and lower than 6.3 g/cm$^3$.

Note that there is a possibility that an oxide semiconductor film having a certain composition cannot exist in a single crystal structure. In that case, single crystal oxide semiconductor films with different compositions are combined at an adequate ratio, which makes it possible to calculate density equivalent to that of a single crystal oxide semiconductor film with the desired composition. The density of a single crystal oxide semiconductor film having the desired composition can be calculated using a weighted average according to the combination ratio of the single crystal oxide semiconductor films with different compositions. Note that it is preferable to use as few kinds of single crystal oxide semiconductor films as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the treatment chamber may be reduced. The concentration of impurities in a deposition gas may also be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, migration occurs on the substrate when the flat-plate-like or pellet-like sputtered particle reaches the substrate, so that a flat plane of the sputtered particle is attached to the substrate.

Furthermore, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the target, an In—Ga—Zn oxide target is described below.

The In—Ga—Zn oxide target, which is polycrystalline, is made by mixing InO$_X$ powder, GaO$_Y$ powder, and ZnO$_Z$ powder in a predetermined molar ratio; applying pressure; and performing heat treatment at a temperature higher than or equal to 1000° C. and lower than or equal to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder may be determined as appropriate depending on a target to be formed.

An alkali metal is not a constituent element of an oxide semiconductor and thus is an impurity. Also, alkaline earth metal is an impurity in the case where the alkaline earth metal is not a constituent element of the oxide semiconductor. Alkali metal, in particular, Na becomes Na$^+$ when an insulating film in contact with the oxide semiconductor film is an oxide and Na diffuses into the insulating film. In addition, in the oxide semiconductor film, Na cuts or enters a bond between metal and oxygen which are included in the oxide semiconductor. As a result, the electrical characteristics of the transistor deteriorate, for example, the transistor is placed in a normally-on state because of a negative shift of the threshold voltage or the mobility is decreased. In addition, the characteristics of transistors vary. Specifically, the Na concentration measured by secondary ion mass spectrometry is preferably 5×10$^{16}$/cm$^3$ or lower, further preferably 1×10$^{16}$/cm$^3$ or lower, still further preferably 1×10$^{15}$/cm$^3$ or lower. Similarly, the measured Li concentration is preferably 5×10$^{15}$/cm$^3$ or lower, further preferably 1×10$^{15}$/cm$^3$ or lower. Similarly, the measured K concentration is preferably 5×10$^{15}$/cm$^3$ or lower, further preferably 1×10$^{15}$/cm$^3$ or lower.

In the case where a metal oxide containing indium is used, silicon or carbon having higher bond energy with oxygen than that of indium might cut the bond between indium and oxygen, so that an oxygen vacancy is formed. Accordingly, when silicon or carbon is contained in the oxide semiconductor film, the electrical characteristics of the transistor are likely to deteriorate as in the case of using an alkali metal or an alkaline earth metal. Thus, the concentration of silicon and the concentration of carbon in the oxide semiconductor film are preferably low. Specifically, the C concentration or the Si concentration measured by secondary ion mass spectrometry is preferably less than or equal to 1×10$^{18}$/cm$^3$. In this case, the deterioration of the electrical characteristics of the transistor can be prevented, so that the reliability of a semiconductor device can be improved.

<Examples of Electronic Device>

A semiconductor device of one embodiment of the present invention can be used for display devices, personal computers, or image reproducing devices provided with recording media (typically, devices that reproduce the content of recording media such as digital versatile discs (DVD) and have displays for displaying the reproduced images). Further, as electronic devices that can include the semiconductor device of one embodiment of the present invention, cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 14A to 14F illustrate specific examples of these electronic devices.

Figure 14A:
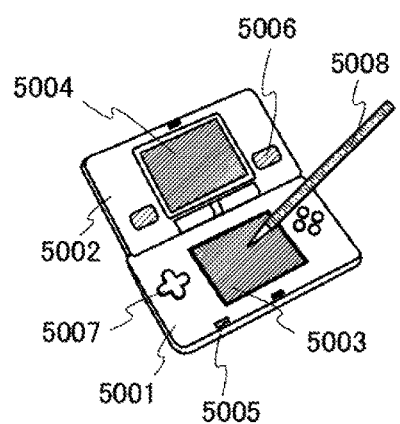
FIGS. 14A to 14F each illustrate an electronic device.

FIG. 14A illustrates a portable game machine, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for a variety of integrated circuits included in portable game machines. Although the portable game machine in FIG. 14A has the two display portions 5003 and 5004, the number of display portions included in the portable game machine is not limited thereto.

Figure 14B:
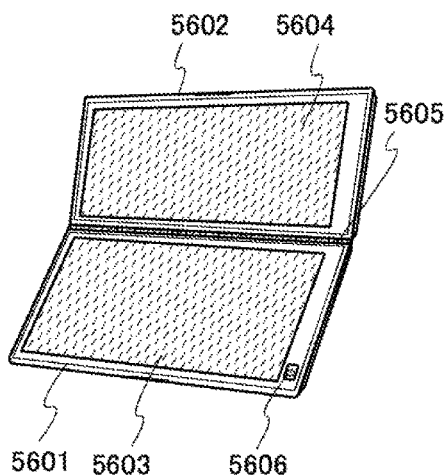

FIG. 14B illustrates a portable information terminal, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel portion of a display device.

Figure 14C:
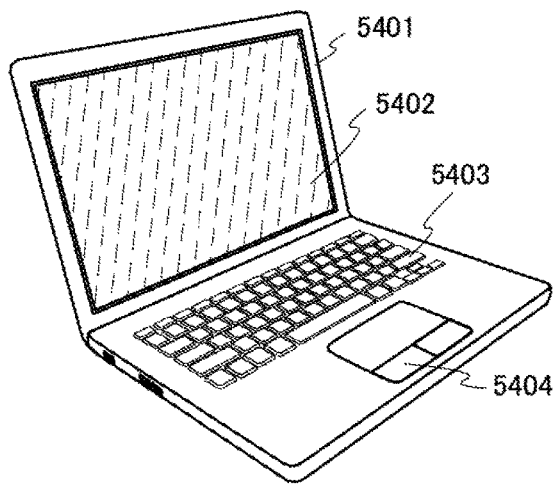

FIG. 14C illustrates a notebook computer, which includes a housing 5401, a display portion 5402, a keyboard 5403, a pointing device 5404, and the like. The semiconductor device of one embodiment of the present invention can be used for a variety of integrated circuits included in notebook personal computers.

Figure 14D:
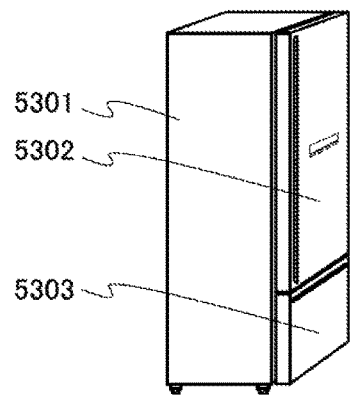

FIG. 14D illustrates an electric refrigerator-freezer, which includes a housing 5301, a refrigerator door 5302, a freezer door 5303, and the like. The semiconductor device of one embodiment of the present invention can be used for a variety of integrated circuits included in electric refrigerator-freezers.

Figure 14E:
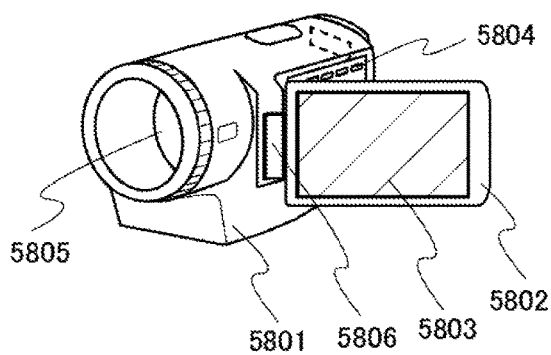

FIG. 14E illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

Figure 14F:
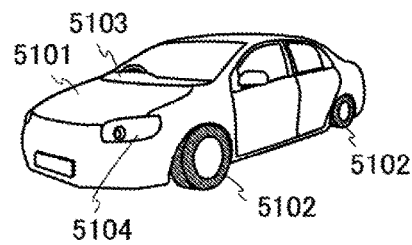

FIG. 14F illustrates an automobile, which includes a car body 5101, wheels 5102, a dashboard 5103, lights 5104, and the like. The semiconductor device of one embodiment of the present invention can be used for a variety of integrated circuits included in automobiles.

This application is based on Japanese Patent Application serial no. 2013-230922 filed with Japan Patent Office on Nov. 7, 2013, the entire contents of which are hereby incorporated by reference.

What is claimed is:

1. A semiconductor device comprising:
a first circuit comprising a memory circuit; and
a second circuit,
wherein the first circuit is configured to store configuration data in the memory circuit to make a signal for an operation test of the second circuit, and
wherein the first circuit serves as a first set of a set associative buffer memory device of the second circuit after the operation test.

2. The semiconductor device according to claim 1,
wherein the first circuit comprises a first transistor and a second transistor, and
wherein a first terminal of the first transistor is electrically connected to a gate of the second transistor.

3. The semiconductor device according to claim 1,
wherein the first circuit comprises a first transistor and a second transistor,
wherein a first terminal of the first transistor is electrically connected to a gate of the second transistor, and
wherein on/off of the second transistor is selected according to the data input through the first transistor.

4. The semiconductor device according to claim 1,
wherein the first circuit comprises a first transistor and a second transistor,
wherein a first terminal of the first transistor is electrically connected to a gate of the second transistor, and
wherein the first transistor comprises a channel formation region comprising an oxide semiconductor.

5. The semiconductor device according to claim 1,
wherein the first circuit comprises a first transistor and a second transistor,
wherein a first terminal of the first transistor is electrically connected to a gate of the second transistor,
wherein on/off of the second transistor is selected according to the data input through the first transistor, and
wherein the first transistor comprises a channel formation region comprising an oxide semiconductor.

6. The semiconductor device according to claim 1,
wherein the first circuit comprises a first transistor and a second transistor,
wherein a first terminal of the first transistor is electrically connected to a gate of the second transistor,
wherein the first transistor comprises a channel formation region comprising an oxide semiconductor, and
wherein the oxide semiconductor comprises In, Ga, and Zn.

7. The semiconductor device according to claim 1,
wherein the first circuit comprises a first transistor and a second transistor,
wherein a first terminal of the first transistor is electrically connected to a gate of the second transistor,
wherein on/off of the second transistor is selected according to the data input through the first transistor,
wherein the first transistor comprises a channel formation region comprising an oxide semiconductor, and
wherein the oxide semiconductor comprises In, Ga, and Zn.

* * * * *